United States Patent
Han et al.

(10) Patent No.: US 12,377,498 B2
(45) Date of Patent: Aug. 5, 2025

(54) MANUFACTURING METHOD OF DISPLAY DEVICE AND DISPLAY DEVICE MANUFACTURED BY THE METHOD

(71) Applicant: Samsung Display Co., Ltd., Yongin-si (KR)

(72) Inventors: Seoin Han, Yongin-si (KR); Jae-Young Yu, Yongin-si (KR); Bonjoo Koo, Yongin-si (KR); Mingwan Kim, Yongin-si (KR); Ji-Hoon Kim, Yongin-si (KR); Taehyun Lee, Yongin-si (KR); Taehyun Jung, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 232 days.

(21) Appl. No.: 18/096,640

(22) Filed: Jan. 13, 2023

(65) Prior Publication Data
US 2023/0354686 A1  Nov. 2, 2023

(30) Foreign Application Priority Data
Apr. 29, 2022 (KR) .................. 10-2022-0053753

(51) Int. Cl.
| | |
|---|---|
| *B23K 26/60* | (2014.01) |
| *B23K 26/18* | (2006.01) |
| *B23K 26/38* | (2014.01) |
| *B32B 7/12* | (2006.01) |
| *B32B 37/12* | (2006.01) |
| *B32B 38/00* | (2006.01) |

(Continued)

(52) U.S. Cl.
CPC ............. *B23K 26/60* (2015.10); *B23K 26/18* (2013.01); *B23K 26/38* (2013.01); *B32B 7/12* (2013.01);
(Continued)

(58) Field of Classification Search
CPC ........ B23K 26/18; B23K 26/38; B23K 26/60; B32B 2310/0843
See application file for complete search history.

(56) References Cited

U.S. PATENT DOCUMENTS

| | | | |
|---|---|---|---|
| 6,541,730 B2 | 4/2003 | Nam et al. | |
| 8,292,684 B2 | 10/2012 | Kim et al. | |

(Continued)

FOREIGN PATENT DOCUMENTS

| | | |
|---|---|---|
| JP | 2009-32971 | 2/2009 |
| KR | 10-0673073 | 1/2007 |
| KR | 10-1453878 | 10/2014 |

*Primary Examiner* — Scott W Dodds
(74) *Attorney, Agent, or Firm* — KILE PARK REED & HOUTTEMAN PLLC

(57) ABSTRACT

A method for manufacturing a display device includes providing a preliminary display device including a display module, an optical layer disposed on a first surface of the display module, a first protective film disposed on the optical layer, a second protective film disposed on a second surface of the display module, a first adhesive layer disposed between the optical layer and the first protective film, and a second adhesive layer disposed between the second protective film and the display module, forming a mask layer on the first protective film by irradiating a first laser light on the first protective film along a first processing line, and cutting the preliminary display device at an outer periphery of the second processing line by irradiating a second laser light on the first protective film along a second processing line positioned at an outer periphery of the first processing line.

19 Claims, 19 Drawing Sheets

(51) Int. Cl.
    *B32B 43/00*     (2006.01)
    *H05K 5/03*     (2006.01)
    *H10K 59/80*     (2023.01)
    *H10K 71/50*     (2023.01)

(52) U.S. Cl.
    CPC .......... *B32B 37/12* (2013.01); *B32B 38/0004* (2013.01); *B32B 43/006* (2013.01); *H05K 5/03* (2013.01); *H10K 59/8722* (2023.02); *B32B 2307/42* (2013.01); *B32B 2307/732* (2013.01); *B32B 2310/0843* (2013.01); *B32B 2367/00* (2013.01); *B32B 2457/20* (2013.01); *H10K 71/50* (2023.02)

(56) References Cited

U.S. PATENT DOCUMENTS

| | | | | |
|---|---|---|---|---|
| 9,120,179 | B2* | 9/2015 | Richter | B28D 5/0011 |
| 10,326,113 | B2* | 6/2019 | Yug | H10K 59/131 |
| 2003/0217806 | A1* | 11/2003 | Tait | B23K 26/38 |
| | | | | 156/254 |
| 2007/0190886 | A1* | 8/2007 | Satoh | H01J 11/44 |
| | | | | 445/24 |
| 2009/0045486 | A1 | 2/2009 | Kohda | |
| 2012/0099056 | A1* | 4/2012 | Lee | G02F 1/133512 |
| | | | | 445/24 |
| 2012/0131958 | A1* | 5/2012 | Shimoi | C03C 23/0025 |
| | | | | 65/31 |
| 2013/0235278 | A1* | 9/2013 | Tanaka | G02F 1/133512 |
| | | | | 349/110 |
| 2015/0107752 | A1* | 4/2015 | Olsson | B29C 66/3452 |
| | | | | 156/219 |
| 2015/0246840 | A1* | 9/2015 | Kawaguchi | B23K 26/40 |
| | | | | 225/2 |
| 2015/0276994 | A1* | 10/2015 | Shen | G02B 3/0012 |
| | | | | 204/157.41 |
| 2017/0120389 | A1* | 5/2017 | Lee | G02B 5/3033 |
| 2020/0324375 | A1* | 10/2020 | Oh | H10K 59/40 |

* cited by examiner

MANUFACTURING METHOD OF DISPLAY DEVICE AND DISPLAY DEVICE MANUFACTURED BY THE METHOD

CROSS-REFERENCE TO RELATED APPLICATION(S)

This application claims priority to and benefits of Korean Patent Application No. 10-2022-0053753 under 35 U.S.C. § 119, filed on Apr. 29, 2022, the entire contents of which are incorporated hereby by reference.

BACKGROUND

1. Technical Field

Embodiments relate to a method for manufacturing a display device including a cutting process by using laser, and relate to a display device manufactured by the method.

2. Description of the Related Art

A display device may include a display module which displays images, and an optical member, a support member, window member, and the like which are provided at upper and lower portion of the display module. The display device is manufactured through various process steps of providing and processing such members at the upper and lower portions of the display module.

In order to implement a shape required of a final display device, a process of cutting the display module, the optical member, and the like is performed during a manufacturing process of the display device. The cutting process is required to effectively implement the shape of the final display device without causing damage to laminated members and the like.

SUMMARY

Embodiments provide a method for manufacturing a display device capable of improving process reliability by minimizing damage to laminated members in a cutting process, which is performed by using laser light to implement a required shape of the display device, by forming a mask layer before the cutting process.

Embodiments also provide a display device with improved reliability without damage to laminated members without leaving residues of an adhesive layer included in a display module.

However, embodiments of the disclosure are not limited to those set forth herein. The above and other embodiments will become more apparent to one of ordinary skill in the art to which the disclosure pertains by referencing the detailed description of the disclosure given below.

In an embodiment, a method for manufacturing a display device may include providing a preliminary display device including a display module, an optical layer disposed on a first surface of the display module, a first protective film disposed on the optical layer, a second protective film disposed on a second surface of the display module, a first adhesive layer disposed between the optical layer and the first protective film, and a second adhesive layer disposed between the second protective film and the display module, forming a mask layer on the first protective film by irradiating a first laser light on the first protective film along a first processing line, and cutting the preliminary display device at an outer periphery of the second processing line by irradiating providing a second laser light on the first protective film along a second processing line positioned at an outer periphery of the first processing line.

In an embodiment, the method may further include detaching the first protective film after the cutting of the preliminary display device, and providing a window on a first surface of the first adhesive layer from which the first protective film is detached after the detaching of the first protective film.

In an embodiment, the method may further include detaching the second protective film after the cutting of the preliminary display device, and providing a support member on a second surface of the second adhesive layer from which the second protective film is detached after the detaching of the second protective film.

In an embodiment, the first laser light may be ultraviolet light having a center wavelength of about 345 nm, or about 355 nm, and the second laser light may be ultraviolet light having a center wavelength of about 345 nm, or about 355 nm.

In an embodiment, in a plan view, a distance between the first processing line and the second processing line parallel to the first processing line may be a range of about 10 μm to about 30 μm.

In an embodiment, in a plan view, a width of the mask layer may be in a range of about 40 μm to about 50 μm.

In an embodiment, after the forming of the mask layer on the first protective film, the first protective film may include a masking region in which the mask layer is formed, and a transmissive region formed inside the masking region and having a transmittance of the second laser light higher than a transmittance of the masking region.

In an embodiment, the transmittance of the second laser light irradiated on the first protective film and being incident on a first surface of the optical layer through the masking region may be about 7% or less.

In an embodiment, the mask layer may be formed on a first surface of the first protective film, and the mask layer may include a carbide formed by the first laser light, and the carbide having increased surface roughness than the first surface of the first protective film not irradiated with the first laser light.

In an embodiment, a thickness of the mask layer may be a thickness of a portion including the carbide, and the thickness of the mask layer may be about 10 μm or greater.

In an embodiment, the first protective film may include polyethylene terephthalate (PET), and in the first protective film, a transmittance of the first laser light or the second laser light may be about 70% or greater.

In an embodiment, the forming of the mask layer on the first protective film may include irradiating the first laser light once along the first processing line, and the cutting of the preliminary display device may include irradiating the second laser light a plurality of times along the second processing line.

In an embodiment, a total energy of the first laser light irradiated to the first processing line may be in a range of about $\frac{1}{100}$ to about $\frac{1}{70}$ of a total energy of the second laser light irradiated to the second processing line.

In an embodiment, the first protective film and the second protective film may be polymer films, and the first adhesive layer and the second adhesive layer may be optically clear adhesive films or optically clear adhesive resin layers.

In an embodiment, a method for manufacturing a display device may include providing a preliminary display device including a display device region divided into a display region and a non-display region surrounding the display region, and a processing region disposed at the outer periphery of the display device region, forming a masking region on a first surface of the preliminary display device by irradiating a first laser light on the preliminary display device along a first processing line positioned in the non-display region, and removing the processing region by irradiating a second laser light along a second processing line corresponding to a boundary area between the display device region and the processing region.

In an embodiment, the preliminary display device may include a display module, an optical layer disposed on a first surface of the display module, a first protective film disposed on the optical layer, a second protective film disposed on a second surface of the display module, a first adhesive layer disposed between the optical layer and the first protective film, and a second adhesive layer disposed between the second protective film and the display module, and the forming of the masking region may include forming a mask layer on a first surface of the first protective film.

In an embodiment, the first laser light may be incident on the first protective film and the first adhesive layer, but is not incident on the optical layer, and the second laser light may be irradiated to the preliminary display device so as to pass through the boundary area between the display device region and the processing region.

In an embodiment, a cut-surface of the display device region exposed after the removing of the processing region may corresponds to an edge side of the display module.

In an embodiment, the method may further include detaching the first protective film after the removing of the processing region, and then providing a window on a first surface of the first adhesive layer from which the first protective film is detached, and detaching the second protective film after the removing of the processing region, and then providing a support member on a second surface of the second adhesive layer from which the second protective film is detached.

In an embodiment, a display device may include a display module including an active region and a peripheral region disposed at the outer periphery of the active region, an optical layer disposed on a first surface of the display module, a window disposed on the optical layer, a first adhesive layer disposed between the optical layer and the window, and including a first portion overlapping the peripheral region of the display module and having a first transmittance, and a second portion having a second transmittance higher than the first transmittance, a support member disposed on a second surface of the display module, and a second adhesive layer disposed between the support member and the display module, wherein each of the first transmittance and the second transmittance may be a transmittance of ultraviolet light.

In an embodiment, the first transmittance of the first portion of the first adhesive layer may be about 50% or less of the second transmittance.

In an embodiment, a roughness of a first surface of the first portion of the first adhesive layer adjacent to the window may be greater than a roughness of a first surface of the second portion of the first adhesive layer adjacent to the window.

In an embodiment, the first adhesive layer may be an optically clear adhesive film or optically clear adhesive resin layer containing an acrylic polymer, and an average molecular weight of the acrylic polymer in the first portion of the first adhesive layer may be smaller than an average molecular weight of the acrylic polymer in the second portion of the first adhesive layer.

In an embodiment, the width of the first portion may be in a range of about 40 μm to about 50 μm.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION OF THE EMBODIMENTS

Figure 1:
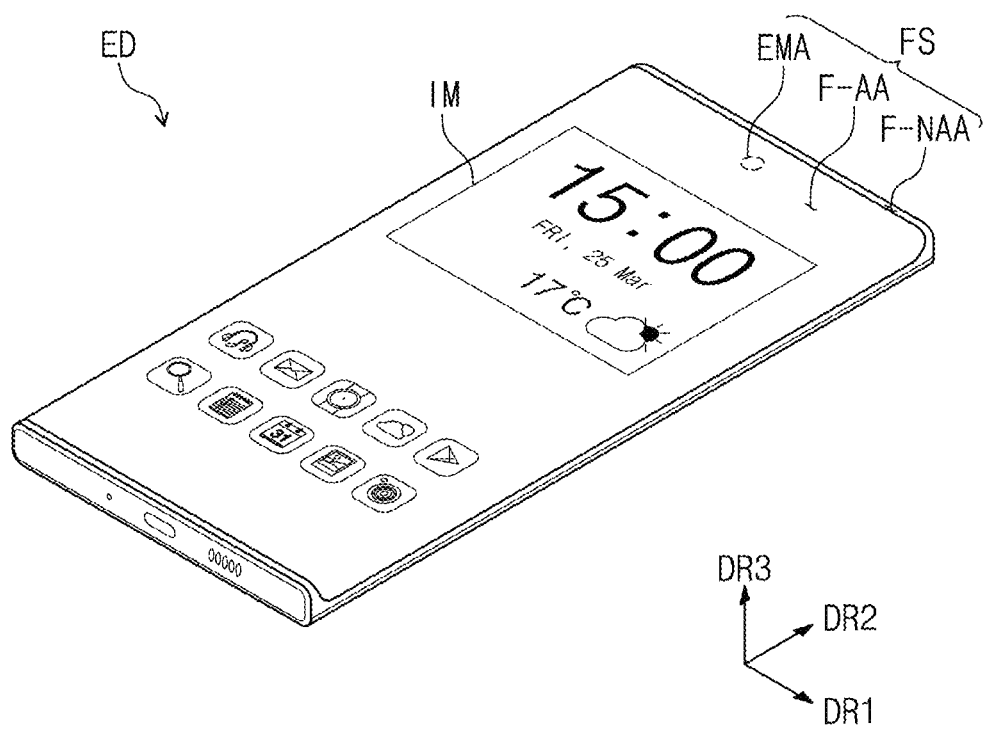
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a display device according to an embodiment of the invention, and a method for manufacturing a display device according to an embodiment thereof will be described with reference to the accompanying drawings.

Figure 2:
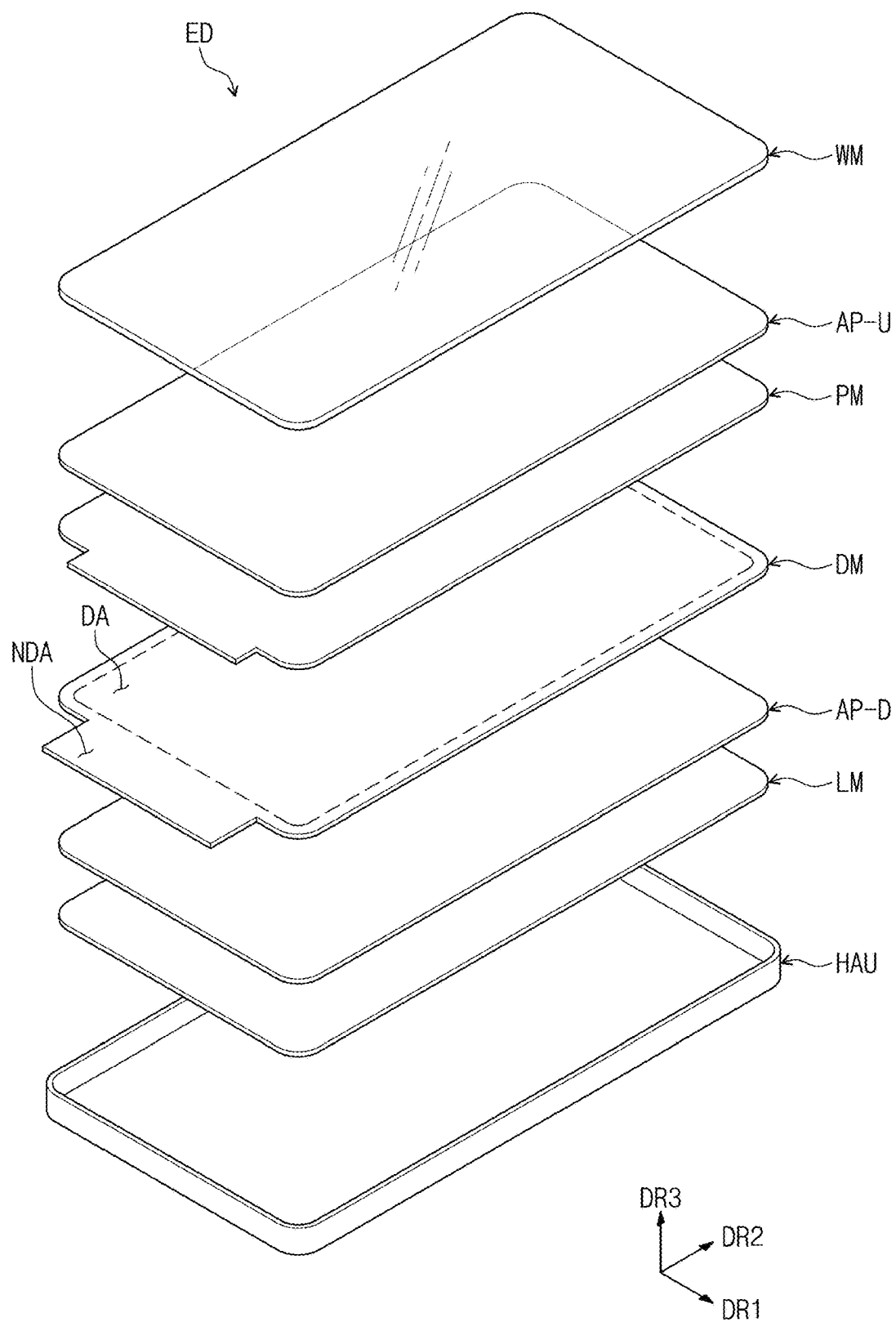
FIG. 2 is a schematic exploded perspective view of a display device according to an embodiment.
Figure 3A:
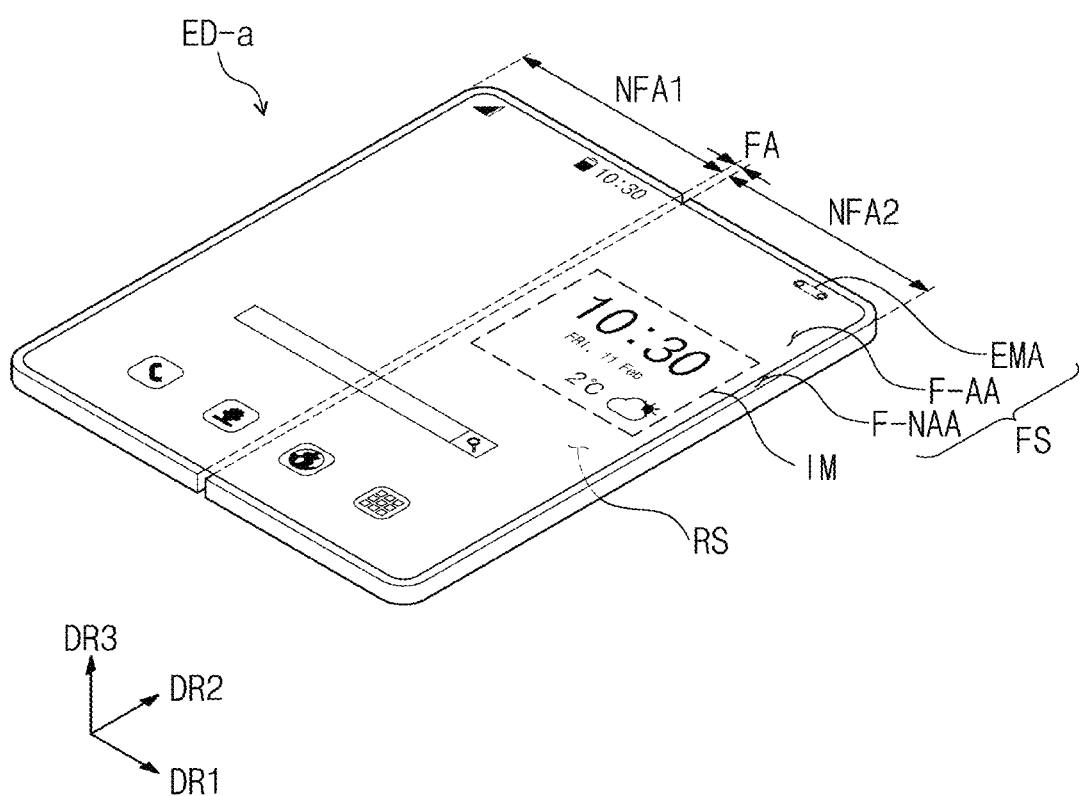
FIG. 3A is a schematic perspective view showing a display device in an unfolded state according to an embodiment.
Figure 3B:
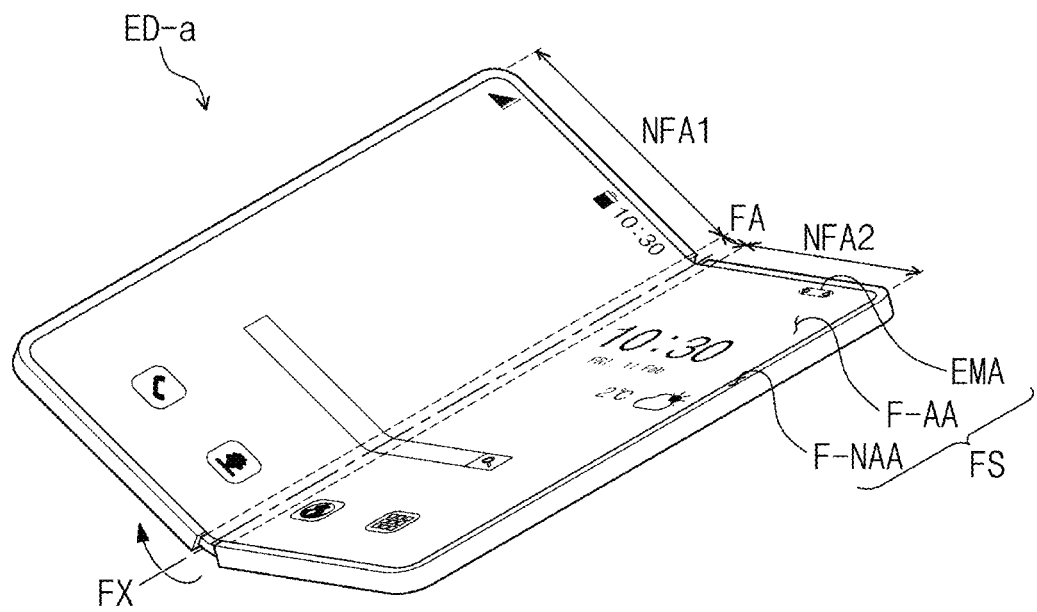
FIG. 3B is a schematic perspective view showing an inner-folding process of the display device of FIG. 3A.
Figure 3B:
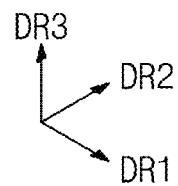
Figure 3C:
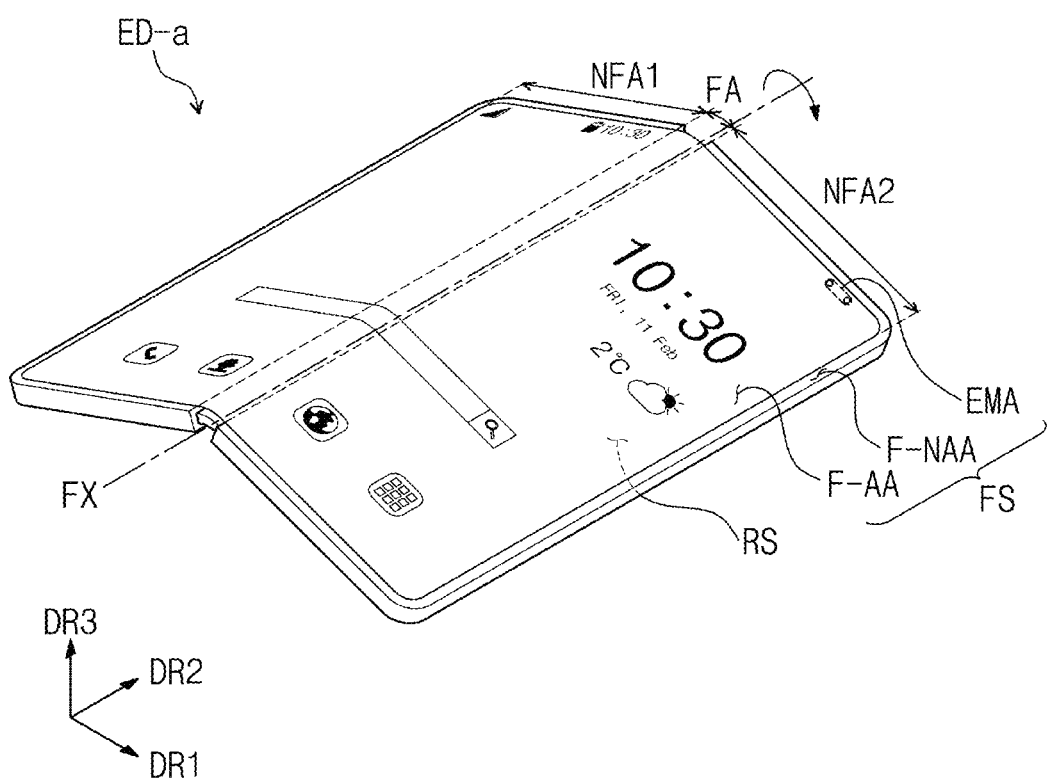
FIG. 3C is a schematic perspective view showing an outer-folding process of the display device of FIG. 3A.
Figure 4:
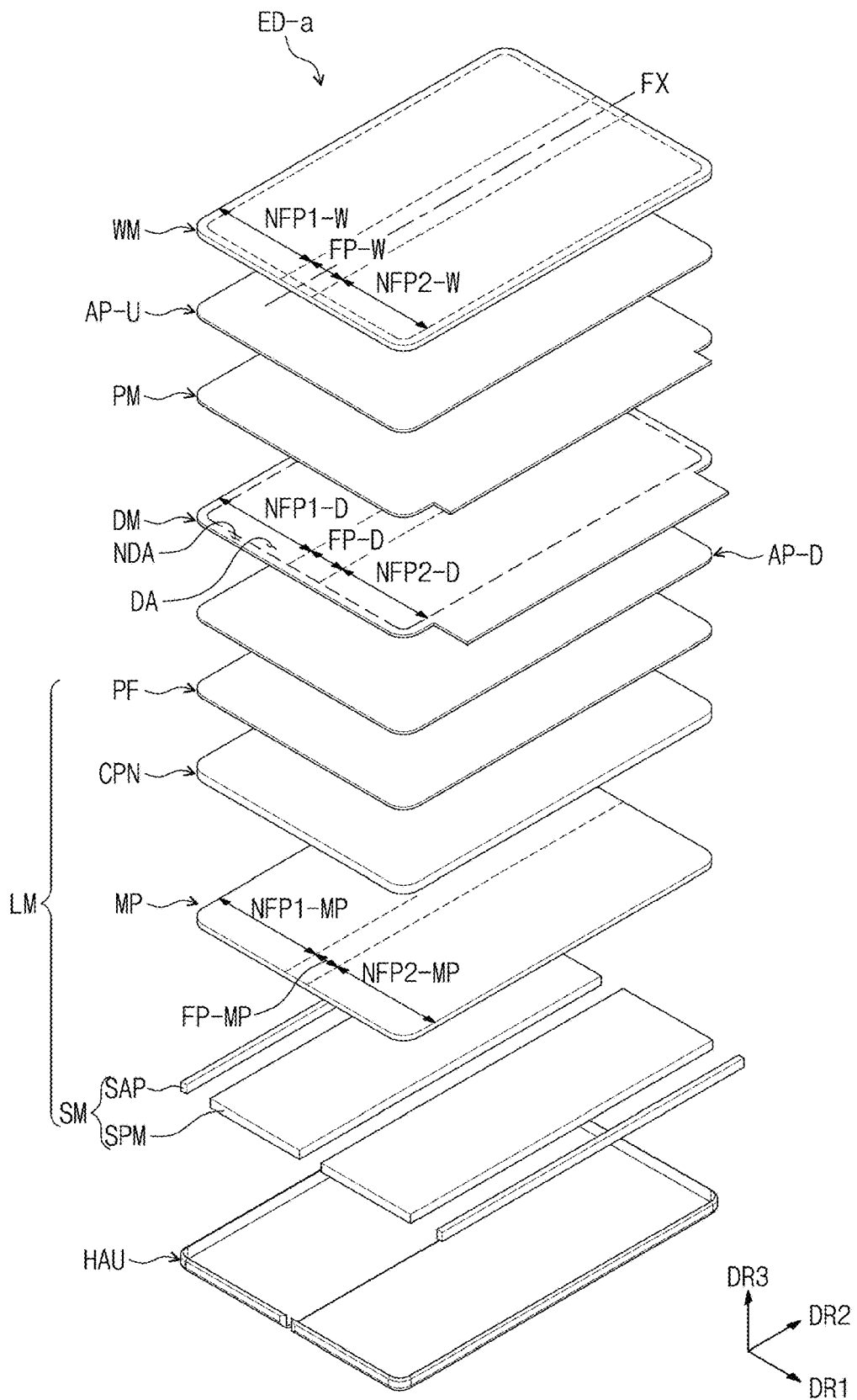
FIG. 4 is a schematic exploded perspective view of a display device according to an embodiment.

FIG. 1 is a schematic perspective view showing a display device according to an embodiment. FIG. 2 is a schematic exploded perspective view of a display device according to an embodiment. FIG. 3A to FIG. 3C are schematic perspective views of a display device according to an embodiment, and FIG. 4 is a schematic exploded perspective view of a display device according to an embodiment. FIG. 2 may be a schematic exploded perspective view of the display device of FIG. 1, and FIG. 4 may be a schematic exploded perspective view of the display device of FIG. 3A to FIG. 3C.

Referring to FIG. 1 to FIG. 4, display devices ED and ED-a according to an embodiment may be a device activated according to an electrical signal. For example, the display devices ED and ED-a may be a mobile phone, a tablet computer, a car navigation system, a game console, or a wearable device, but embodiments are not limited thereto. In FIG. 1 to FIG. 4, the display devices ED and ED-a are illustrated as mobile phones.

In the disclosure, the thickness direction of the display device ED may be a direction parallel to the third direction DR3, which is a normal direction with respect to a plane defined by the first direction DR1 and the second direction DR2. In the disclosure, a front surface (e.g., an upper surface or a first surface) and a rear surface (e.g., a lower surface or a second surface) of members constituting the display device ED may be defined on the basis of the third direction DR3.

Referring to FIG. 1 and FIG. 2, the display device ED according to an embodiment may include a first display surface FS defined by the first direction DR1 and the second direction DR2 intersecting the first direction DR1. The display device ED may provide an image IM to a user through the first display surface FS. The display device ED according to an embodiment may display the image IM toward the third direction DR3 on the first display surface FS parallel to each of the first direction DR1 and the second direction DR2. The first display surface FS may include an active region F-AA and a peripheral region F-NAA. The active region F-AA may include an electronic module region EMA.

The display device ED according to an embodiment may sense an external input applied from the outside. The external input may include various forms of inputs provided from the outside of the display device ED. For example, the external input may include not only a contact by a part of a user's body, such as a hand, but also an external input applied in close proximity to the display device ED, or adjacent thereto at a distance (for example, hovering). Also, the external input may have various forms such as force, pressure, temperature, light, and the like.

The active region F-AA of the display device ED may be a region activated according to an electrical signal. The display device ED according to an embodiment may display the image IM through the active region F-AA. For example, various forms of external inputs may be sensed in the active region F-AA. The peripheral region F-NAA may be adjacent to the active region F-AA. The peripheral region F-NAA may correspond to a portion disposed on the outer periphery of the active region F-AA. The peripheral region F-NAA may correspond to a non-active region.

The peripheral region F-NAA may have a certain color. As compared to the active region F-AA, the peripheral region F-NAA may be a portion having a relatively low transmittance. In the peripheral region F-NAA, shapes of components included in the display device ED may not be exposed to the outside, and for example, the peripheral region F-NAA may be covered by a housing HAU and the like. Accordingly, in case that some of the components included in the display device ED include damaged portions corresponding to the peripheral region F-NAA, the components may not be visually recognized from the outside.

The peripheral region F-NAA may surround the active region F-AA. Accordingly, a shape of the active region F-AA may substantially be defined by the peripheral region F-NAA. However, embodiments are not limited thereto. The peripheral region F-NAA may be disposed adjacent to only one side of the active region F-AA, or may be omitted. The display device ED according to an embodiment may include an active region F-AA in various shapes.

The electronic module region EMA may have various electronic modules disposed therein. For example, an electronic module may include at least one of a camera, a speaker, a light sensing sensor, or a heat sensing sensor. The electronic module region EMA may sense an external object received through the first display surface FS, or may provide a sound signal such as voice to the outside through the first display surface FS. However, embodiments are not limited thereto. The electronic module may include components.

The electronic module region EMA may be surrounded by the active region F-AA and the peripheral region F-NAA. However, embodiments are not limited thereto. The electronic module region EMA may be disposed within the active region F-AA.

Referring to FIG. 2, the display device ED according to an embodiment may include a display module DM, an optical layer PM disposed on an upper side (e.g., an upper surface or a first surface) of the display module DM, and a support member LM disposed on a lower side (e.g., a lower surface or a second surface) of the display module DM. For example, the display device ED may include a window WM disposed on the optical layer PM, a first adhesive layer AP-U disposed between the optical layer PM and the window WM, and a second adhesive layer AP-D disposed between the display module DM and the support member LM. The display device ED may include the housing HAU which accommodates the display module DM, the support member LM, and the like. The housing HAU may be coupled to the window WM.

The window WM may cover an upper surface of the display module DM. The window WM may have a shape corresponding to a shape of the display module DM. The window WM may include glass, and may be used as a cover window of the display device ED. The window WM may be an ultra-thin glass substrate. For example, a protective layer may be further disposed in an upper portion of the window WM. The protective layer may include a polymer film. For example, the protective layer may have a polymer film as a base layer, and may further include, on the base layer, a functional layer such as a hard coating layer, an anti-fingerprint coating layer, an anti-static coating layer, and the like.

The display module DM may display an image in accordance with an electrical signal, and may transmit and receive information on an external input. The display module DM may include a display region DA and a non-display region NDA. The display region DA may be defined as a region which emits the image provided from the display module DM.

The non-display region NDA may be adjacent to the display region DA. For example, the non-display region NDA may surround the display region DA. However, embodiments are not limited thereto. The non-display region NDA may be defined as having various shapes. According to an embodiment, the display region DA of the display module DM may correspond to at least a portion of the active region F-AA.

The support member LM may function as a protective functional layer which protects the display module DM, or as a support layer. For example, in the display device ED according to an embodiment, the support member LM may be a protective film layer of a polymer material. However, embodiments are not limited thereto, and the support member LM may additionally include functional layers in addition to the protective film layer. For example, the support member LM may include functional layers such as a protective film layer, a shock resistant layer, a heat dissipation layer, and the like.

As compared to the display device ED of an embodiment of FIG. 1 and FIG. 2, there is a difference in that the display device ED-a of FIG. 3A to FIG. 3C, and FIG. 4 includes at least one folding region. Hereinafter, in the description of the display device ED-a according to an embodiment, the same contents as those described above on the display device ED with reference to FIG. 1 and FIG. 2 will not be described for descriptive convenience. Instead, differences will be described.

The display device ED-a according to an embodiment may include a folding region FA and non-folding regions NFA1 and NFA2. In an embodiment, the non-folding regions NFA1 and NFA2 may be disposed adjacent to the folding region FA with the folding region FA disposed therebetween. The display device ED-a according to an embodiment may include a first non-folding region NFA1 and a second non-folding region NFA2, which are spaced apart from each other in the first direction DR1 with the folding region FA disposed therebetween. For example, the first non-folding region NFA1 may be disposed on a side of the folding region FA along the first direction DR1, and the second non-folding region NFA2 may be disposed on another side of the folding region FA along the first direction DR1.

FIG. 3A to FIG. 3C illustrate an embodiment of the display device ED-a including a single folding region FA, but embodiments are not limited thereto, and the display device ED-a may have folding regions defined therein. For example, a display device according to an embodiment may include two or more folding regions, and may include three or more non-folding regions disposed with each of the folding regions disposed therebetween.

The display device ED-a according to an embodiment may include a first display surface FS and a second display surface RS. The first display surface FS may include an active region F-AA and a peripheral region F-NAA. The active region F-AA may include an electronic module region EMA. The second display surface RS may be defined as a surface opposing at least a portion of the first display surface FS. For example, the second display surface RS may be defined as a portion of a rear surface of the display device ED-a.

Referring to FIG. 3B, the display device ED-a according to an embodiment may be folded with respect to a folding axis FX. The folding axis FX may be a virtual axis extended in the second direction DR2, and the folding axis FX may be parallel to a direction of a long side of the display device ED-a. The folding axis FX may be extended along the second direction DR2 on the first display surface FS.

The display device ED-a may be folded with respect to the folding axis FX and transformed into an inner-folded state in which, in the first display surface FS, a region overlapping the first non-folding region NFA1 and another region overlapping the second non-folding region NFA2 face each other.

In the inner-folded state, the second display surface RS of the display device ED-a according to an embodiment may be visually recognized by a user. However, embodiments are not limited thereto. The second display surface RS may further include an electronic module region in which an electronic module including various components is disposed.

Referring to FIG. 3C, the display device ED-a according to an embodiment may be folded with respect to the folding axis FX and transformed into an out-folded state in which, in the second display surface RS, a region overlapping the first non-folding region NFA1 and another region overlapping the second non-folding region NFA2 face each other.

However, embodiments are not limited thereto, and the display device ED-a may be folded with respect to folding axes such that a portion of each of the first display surface FS and the second display surface RS may be folded to face each other, and the number of folding axes and the number of non-folding regions in accordance therewith are not limited.

The first display surface FS and the second display surface RS may include the electronic module region EMA. The electronic module region EMA may sense an external object received through the first or second display surface FS or RS, or may provide a sound signal such as voice to the outside through the first or second display surface FS or RS. However, embodiments are not limited thereto. The electronic module may include components.

Unlike what is illustrated in FIG. 3A to FIG. 3C, in a display device according to an embodiment, an extension direction of a folding axis may be parallel to an extension direction of a short side of the display device.

In an embodiment, the display device ED-a may perform an inner-folding or outer-folding operation that is alternatively repeated from an un-folding operation, but embodiments are not limited thereto. In an embodiment, the display device ED-a may selectively perform one of the un-folding operation, the inner-folding operation, and the outer-folding operation. For example, in case that folding regions are included, a folding direction of at least one folding region thereof may be different from folding directions of the rest of the folding regions. For example, in case that two folding regions are included, two non-folding regions having one folding region disposed therebetween may be folded by the inner-folding operation, and two non-folding regions having the other folding region disposed therebetween may be folded by the outer-folding operation.

Referring to FIG. 4, the display device ED-a may include a display module DM, an optical layer PM disposed on an upper side (e.g., an upper surface or a first surface) of the display module DM, and a support member LM disposed on a lower side (e.g., a lower surface or a second surface) of the display module DM. For example, the display device ED-a may include a window WM disposed on the optical layer PM, a first adhesive layer AP-U disposed between the optical layer PM and the window WM, and a second adhesive layer AP-D disposed between the display module DM and the support member LM. The display device ED-a may include a housing HAU which accommodates the display module DM, the support member LM, and the like. The housing HAU may be coupled to the window WM. In an embodiment, the housing HAU may further include a hinge structure for facilitating (or performing) folding and bending operations.

In the display device ED-a of FIG. 4, the window WM may include a folding portion FP-W and non-folding portions NFP1-W and NFP2-W. A first non-folding portion NFP1-W and a second non-folding portion NFP2-W of the window WM may be spaced apart from each other in the first direction DR1 with the folding portion FP-W disposed therebetween. The folding portion FP-W may be a portion corresponding to the folding region FA (see FIG. 3A), and the non-folding portions NFP1-W and NFP2-W may be portions corresponding to the non-folding regions NFA1 and NFA2 (see FIG. 3A).

The display module DM may display an image in accordance with an electrical signal, and may transmit and receive information on an external input. The display module DM may include a display region DA and a non-display region NDA.

The display module DM may include a folding display portion FP-D and non-folding display portions NFP1-D and NFP2-D. The folding display portion FP-D may be a portion corresponding to the folding region FA (see FIG. 3A), and the non-folding display portions NFP1-D and NFP2-D may be portions corresponding to the non-folding regions NFA1 and NFA2 (see FIG. 3A).

The folding display portion FP-D may correspond to a portion folded or bent with respect to the folding axis FX. The display module DM may include a first non-folding display portion NFP1-D and a second non-folding display portion NFP2-D, wherein the first non-folding portion NFP1-D and the second non-folding display portion NFP2-D may be spaced apart from each other with the folding display portion FP-D disposed therebetween.

In the display device ED-a according to an embodiment, the support member LM may include a support plate MP. In an embodiment, the support member LM may further include at least one of a support module SM, a protective layer PF, or a buffer layer CPN. For example, the display device ED-a according to an embodiment may include the support plate MP disposed on a lower side (e.g., a lower surface or a second surface) of the display module DM, the protective layer PF and the buffer layer CPN disposed between the support plate MP and the display module DM, and the support module SM disposed on a lower side (e.g., a lower surface or a second surface) of the support plate MP.

In an embodiment, the support plate MP may include a folding support portion FP-MP and non-folding support portions NFP1-MP and NFP2-MP. A first non-folding support portion NFP1-MP and a second non-folding support portion NFP2-MP of the support plate MP may be spaced apart from each other with the folding support portion FP-MP disposed therebetween. The folding support portion FP-MP may be a portion corresponding to the folding region FA (see FIG. 3A), and the non-folding support portions NFP1-MP and NFP2-MP may be portions corresponding to the non-folding regions NFA1 and NFA2 (see FIG. 3A).

Referring to FIG. 4, the protective layer PF may be disposed between the display module DM and support plate MP. The protective layer PF may be a layer disposed on the lower side of the display module DM to support the rear surface of the display module DM. The protective layer PF may overlap (e.g., entirely overlap) the display module DM. The protective layer PF may include a polymer material. For example, the protective layer PF may be a polyimide film or a polyethylene terephthalate film. However, embodiments are not limited thereto, and the material of the protective layer PF is not limited thereto.

In the display device ED-a according to an embodiment, the support module SM may include a support portion SPM and a filling portion SAP. The support portion SPM may be a portion overlapping most regions of the display module DM. The filling portion SAP may be a portion disposed on the outer side of the support portion SPM and overlapping the outer periphery of the display module DM.

For example, the support member LM may further include a cushion layer, a shielding layer, and a bonding layer. The cushion layer may prevent pressing or deformation of the support plate MP caused by external impact or force, and the shielding layer may function as an electromagnetic wave shielding layer or a heat dissipation layer. The bonding layer may function as an interlayer bonding layer which bonds components included in the support member LM to each other.

Figure 5:
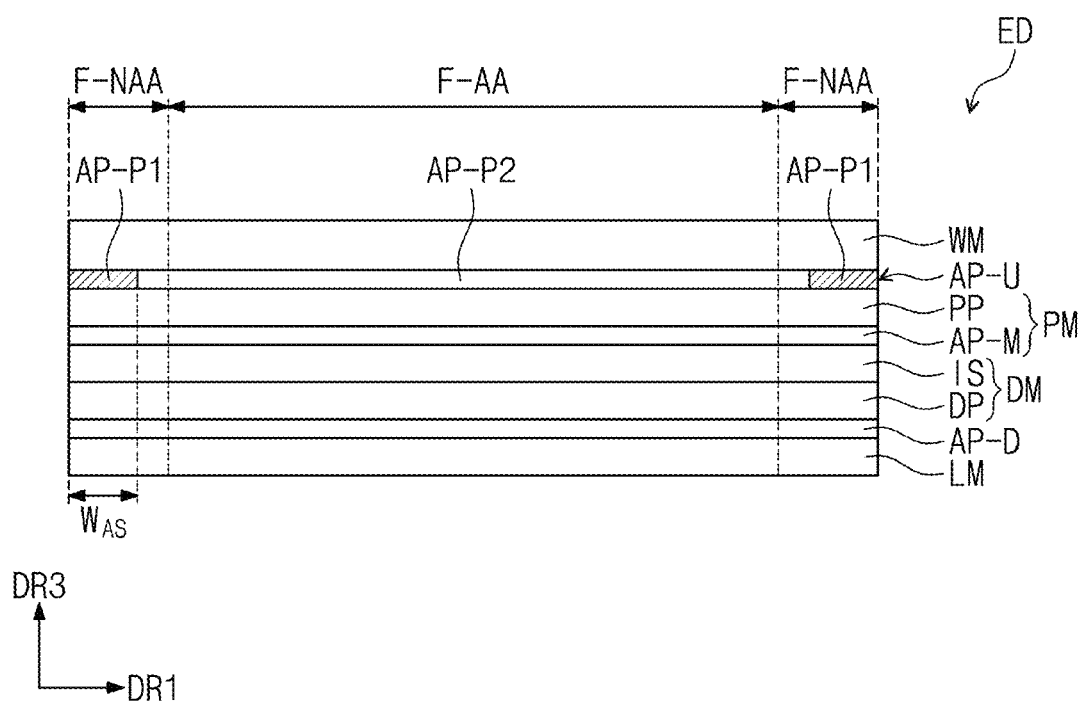
FIG. 5 is a schematic cross-sectional view of a display device according to an embodiment.

FIG. 5 is a schematic cross-sectional view showing a display device according to an embodiment. FIG. 5 illustrates a cross-section of a display device of FIG. 1 and FIG. 2, but embodiments are not limited thereto, and the same contents may be applied to a display device illustrated in FIG. 3A to FIG. 4, e.g., the display device deformed by a folding operation.

The display device ED of FIG. 5 may be manufactured by a method for manufacturing a display device according to an embodiment. The display device ED may include the display module DM, the optical layer PM disposed on an upper side (e.g., an upper surface or a first surface) of the display module DM, the window WM disposed on an upper side (e.g., an upper surface or a first surface) of the optical layer PM, the first adhesive layer AP-U disposed between the optical layer PM and the window WM, the support member LM disposed on a lower side (e.g., a lower surface or a second surface) of the display module DM, and the second adhesive layer AP-D disposed between the support member LM and the display module DM. In the display device ED according to an embodiment, the first adhesive layer AP-U may include a first portion AP-P1 having a first transmittance and a second portion AP-P2 having a second transmittance. The second transmittance of the second portion AP-P2 may be greater than the first transmittance of the first portion AP-P1. For example, the transmittance of the first adhesive layer AP-U in the first portion AP-P1 and the second portion AP-P2 may be a transmittance with respect to ultraviolet light.

In an embodiment, the display module DM may include the display panel DP. The display panel DP may be a light emitting type display panel, but embodiments are not limited thereto. For example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum load, and the like.

The display module DM may further include an input sensor IS. The input sensor IS may be disposed (e.g., directly disposed) on the display panel DP. The input sensor IS may include sensing electrodes. The input sensor IS may sense an external input in a self-capacitance manner or mutual capacitance manner. The input sensor IS may sense an input by an active-type input device.

In manufacturing the display panel DP, the input sensor IS may be formed (e.g., directly formed) on the display panel DP through a continuous process. However, embodiments are not limited thereto, and the input sensor IS may be manufactured as a separate panel from the display panel DP, and be attached to the display panel DP by an adhesive layer.

The optical layer PM may be disposed above the display module DM. The optical layer PM may perform a function of reducing reflection by an external light. The optical layer PM may include optical members for improving display quality of the display device ED. For example, the optical layer PM may include a polarizing layer PP. However, embodiments are not limited thereto. The optical layer PM may include a color filter layer, or may include laminated optical film layers.

For example, in case that the polarizing layer PP included in the optical layer PM has a structure in which film layers are laminated, the polarizing layer PP may include a polarizer layer, and may further include at least one layer among a phase delay layer, a support layer, and a protective layer in addition to the polarizer layer. For example, polarizing layer PP may be a single-layered polarizer layer.

In an embodiment, the polarizing layer PP may be a polarizing plate (hereinafter, referred to as the polarizing plate PP) and optical layer PM may include the polarizing plate PP and a third adhesive layer AP-M which bonds the polarizing plate PP and the display module DM. In an embodiment, the entire structure in which the polarizing plate PP and the third adhesive layer AP-M are laminated may be referred to as the optical layer PM.

In an embodiment, the optical layer PM may be disposed (e.g., directly disposed) on the input sensor IS. For example, in case that the input sensor IS is omitted from the display module DM, the optical layer PM may be disposed (e.g., directly disposed) on the display panel DP.

The first adhesive layer AP-U and the second adhesive layer AP-D may each be an optically clear adhesive (OCA) film or an optically clear adhesive resin (OCR) layer.

The first adhesive layer AP-U may be disposed (e.g., directly disposed) between the optical layer PM and the window WM, and may couple the optical layer PM and the window WM to each other. The second adhesive layer AP-D disposed (e.g., directly disposed) between the display module DM and the support member LM, and may couple the display module DM and the support member LM to each other.

The display device ED an embodiment, the first adhesive layer AP-U and the second adhesive layer AP-D may be an acrylic adhesive. For example, the first adhesive layer AP-U and the second adhesive layer AP-D may each be an optically clear adhesive film including acrylic polymers, or an optically clear adhesive resin layer including acrylic polymers.

For example, the first adhesive layer AP-U and the second adhesive layer AP-D may be optically clear layers having a high transmittance of ultraviolet light. For example, the first adhesive layer AP-U and the second adhesive layer AP-D may have a transmittance of 90% or greater of ultraviolet light with a center wavelength of about 343 nm.

The display module DM may include the active region F-AA and the peripheral region F-NAA. In an embodiment, the first portion AP-P1 of the first adhesive layer AP-U may be a portion disposed corresponding to the peripheral region F-NAA. In the upper surface of the first adhesive layer AP-U adjacent to the window WM, a roughness of an upper surface of the first portion AP-P1 may be greater than a roughness of an upper surface of the second portion AP-P2. Accordingly, light provided to the first adhesive layer AP-U may be more scattered in the first portion AP-P1, and thus, the light transmittance in the first portion AP-P1 may be further decreased.

The first transmittance in the first portion AP-P1 may be 50% or less of the second transmittance in the second portion AP-P2. For example, in case that ultraviolet light having a center wavelength of about 343 nm is provided to the first adhesive layer AP-U, the transmittance of ultraviolet light transmitting the first portion AP-P1 may be 50% or less of the transmittance of ultraviolet light transmitting the second portion AP-P2.

For example, the average molecular weight of the acrylic polymers included in the first portion AP-P1 may be less than the average molecular weight of the acrylic polymers included in the second portion AP-P2. In a method for manufacturing a display device according to an embodiment to be described below, laser light may be provided (or irradiated) to a portion of the first adhesive layer AP-U, and at this time, in the portion to which the laser light is provided (or irradiated), chains of the acrylic polymers may be partially decomposed by the light provided. Accordingly, the first portion to which the laser light is provided may have some damage to an adhesive layer compared to the second portion AP-P2 to which the laser light is not provided, and accordingly, may have a decreased average molecular weight of the acrylic polymers.

A width $W_{AS}$ of the first portion AP-P1 may be about 40 μm to about 50 μm. The first portion AP-P1 may be disposed in at least a portion of the peripheral region F-NAA.

Hereinafter, referring to FIG. 6 to FIG. 13, a method for manufacturing a display device according to an embodiment will be described. In the description of the method for manufacturing a display device according to an embodiment, the same contents as those described in the description of the display device according to an embodiment with reference to FIG. 1 to FIG. 5 will not be described for descriptive convenience, and instead, differences will be described.

Figure 6:
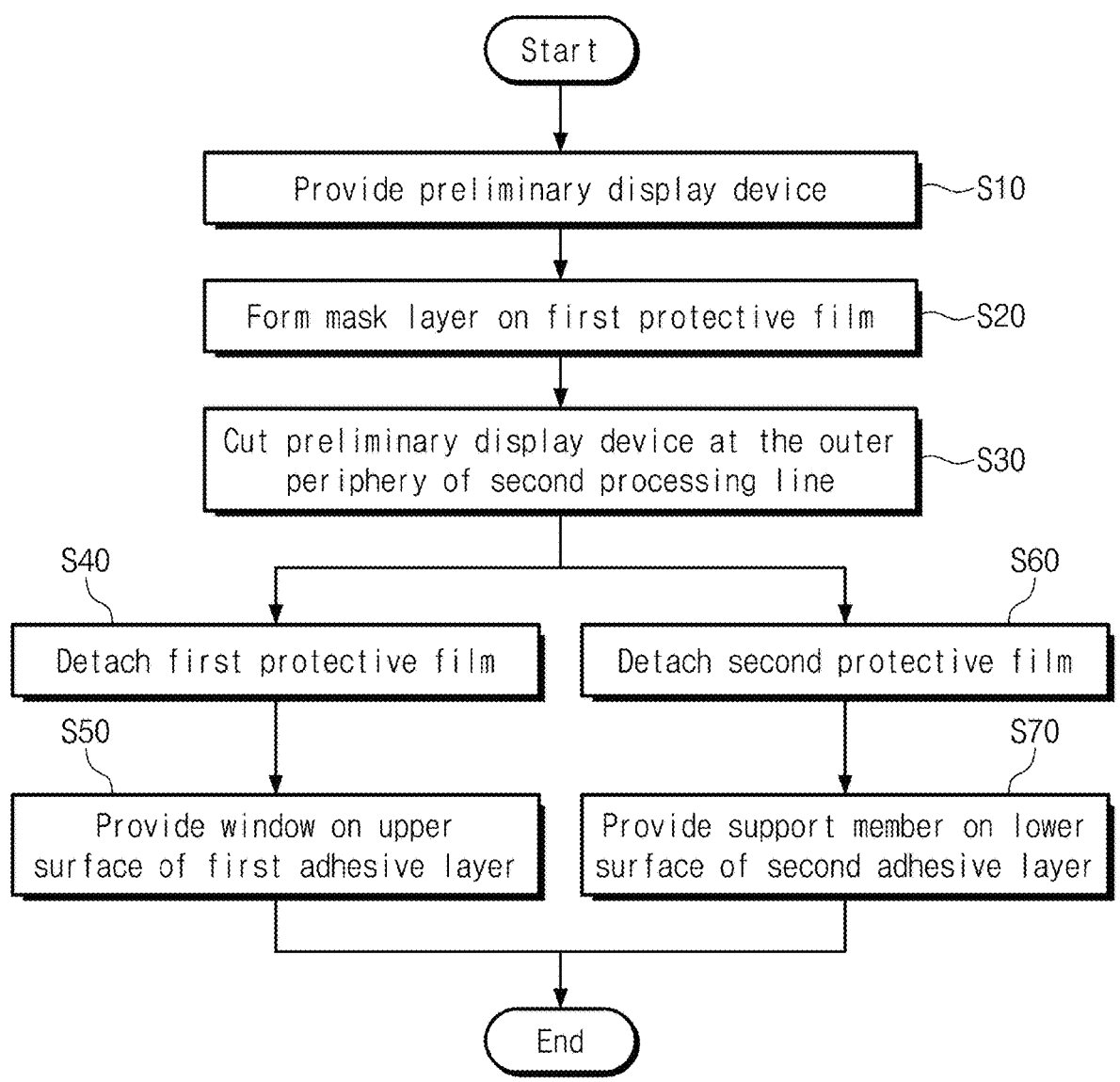
FIG. 6 is a flowchart showing of a method for manufacturing a display device according to an embodiment.

FIG. 6 is a flowchart showing of a method for manufacturing a display device according to an embodiment. The method for manufacturing a display device according to an embodiment may include provides a preliminary display device (S10), forming a mask layer on a first protective film PF-U (S20), and cutting the preliminary display device at the outer periphery of a second processing line (S30). In the disclosure, the forming of the mask layer on the first protective film PF-U (S20) may be referred to as a step of forming a masking region on an upper surface of the preliminary display device, and the cutting of the preliminary display device at the outer periphery of the second processing line (S30) may be referred to as a step of removing a processing region by irradiating a second laser light.

The method for manufacturing a display device according to an embodiment may further include, after the cutting of the preliminary display device at the outer periphery of the second processing line (S30), detaching the first protective film PF-U (S40), and providing a window on an upper surface of a first adhesive layer AP-U (S50). For example, the method for manufacturing a display device according to an embodiment may further include, after the cutting of the preliminary display device at the outer periphery of the second processing line (S30), detaching a second protective film PF-D (S60), and providing a support member on a lower surface of a second adhesive layer AP-D (S70).

In an embodiment, the detaching of the first protective film PF-U (S40) and the providing of the window on the upper surface of the first adhesive layer AP-U (S50) may be performed first, and then the detaching of the second protective film PF-D (S60) and the providing of the support member on the lower surface of the second adhesive layer AP-D (S70) may be performed. For example, the detaching of the second protective film PF-D (S60) and the providing of the support member on the lower surface of the second adhesive layer AP-D (S70) may be performed first, and then the providing of the window on the upper surface of the first adhesive layer AP-U (S50) may be performed.

Hereinafter, referring to FIG. 7A to FIG. 13, the method for manufacturing a display device according to an embodiment will be described in more detail. FIG. 7A to FIG. 13 illustrates a step of manufacturing a display device by processing a preliminary display device. For example, preliminary display devices referred as first to fourth preliminary display devices PED-S1, PED-S2, PED-S3, and PED-S4 in the drawing and the disclosure refers to display devices in steps before being processed into a final shape required through a cutting process by using laser light.

FIG. 7A to FIG. 8B are schematic views showing the providing of a preliminary display device (S10). Referring to FIG. 7A to FIG. 8B, the providing of the preliminary display device (S10) may be a step of providing the preliminary display device including a display module DM, an optical layer PM disposed on an upper side (e.g., an upper surface or a first surface) of the display module DM, a first protective film PF-U disposed on an upper side (e.g., an upper surface or a first surface) of the optical layer PM, a second protective film PF-D disposed on a lower side (e.g., a lower surface or a second surface) of the display module DM, a first adhesive layer AP-U disposed between the optical layer PM and the first protective film PF-U, and a second adhesive layer AP-D disposed between the second protective film PF-D and the display module DM.

The providing of the preliminary display device (S10) may include providing a first preliminary display device PED-S1 including the display module DM and the optical layer PM, and a second preliminary display device PED-S2 in which protective films PF-U and PF-D and adhesive layers AP-U and AP-D are additionally laminated on the display module DM and the optical layer PM.

Figure 7A:
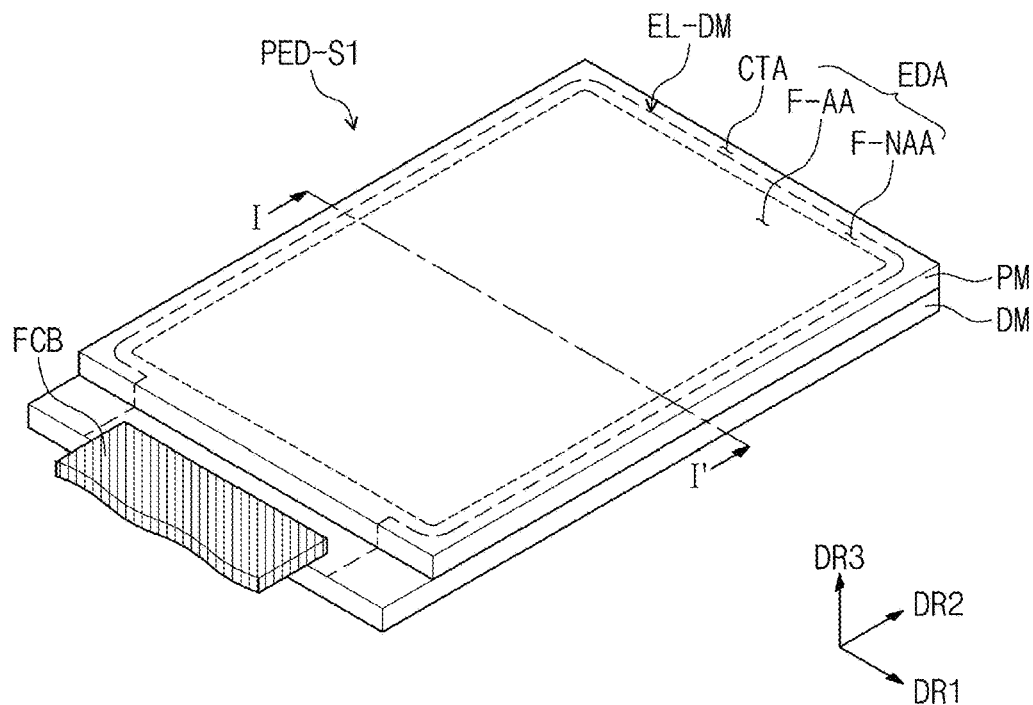
FIG. 7A is a schematic view showing a step of a method for manufacturing a display device according to an embodiment.
Figure 7B:
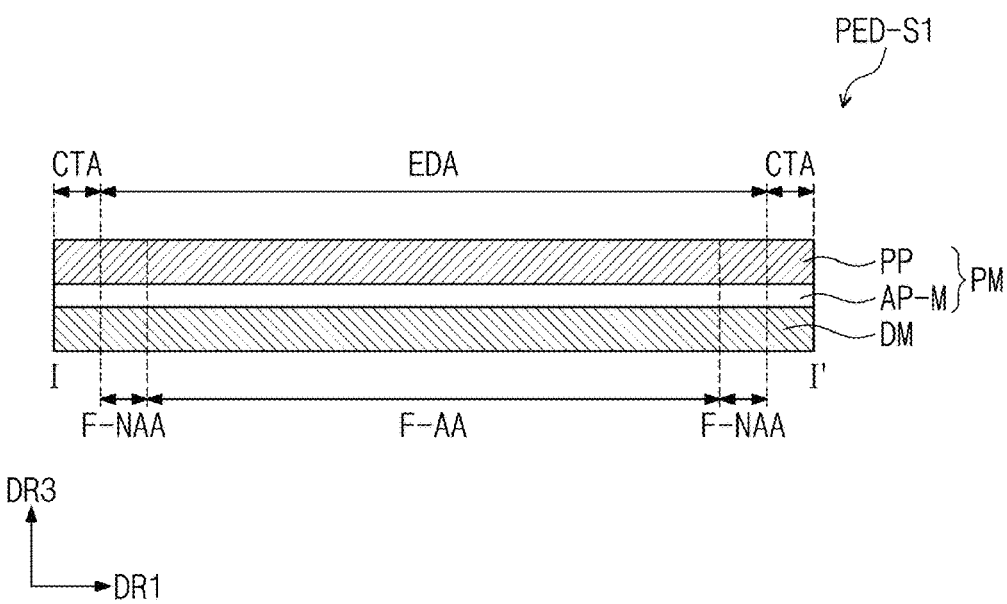
FIG. 7B is a schematic cross-sectional view of a preliminary display device in a step of a method for manufacturing a display device according to an embodiment.

FIG. 7A is a schematic view showing a step of providing the first preliminary display device PED-S1 including a structure in which the display module DM and the optical layer PM are laminated, which is a step of the method for manufacturing a display device, and FIG. 7B is a schematic view showing a cross-section of the first preliminary display device PED-S1. FIG. 7B shows a cross-section corresponding to line I-I' of FIG. 7A.

The first preliminary display device PED-S1 may include a display device region EDA and a processing region CTA. The display device region EDA may include an active region F-AA and a peripheral region F-NAA. For example, the active region F-AA of the display device region EDA may correspond to (or may be aligned with) the active region F-AA of the display devices ED and ED-a illustrated in FIG. 1 to FIG. 3, and the peripheral region F-NAA of the display device region EDA may correspond to (or may be aligned with) the peripheral region F-NAA of the display devices ED and ED-a illustrated in FIG. 1 to FIG. 3.

A display device edge line EL-DM corresponding to a boundary area between the display device region EDA and the processing region CTA may be a portion to which a laser light is provided later, and may be referred to as a second processing line EL-DM. The display device region EDA after the processing region CTA is removed with the display device edge line EL-DM as a boundary area may correspond to (or may be aligned with) the shape of the display device ED (see FIG. 5) of one embodiment.

The first preliminary display device PED-S1 may include the display module DM, and the optical layer PM disposed on the display module DM, and for example, in an embodiment, the optical layer PM may include a polarizing plate PP. The optical layer PM may include the polarizing plate PP and a third adhesive layer AP-M which bonds the polarizing plate PP and the display module DM.

Referring to FIG. 7A, the first preliminary display device PED-S1 may include a driving unit FCB connected (e.g., electrically connected) to one side of the display module DM. The driving unit FCB may include a driving chip which generates or processes various electrical signals. For example, in an embodiment, the driving unit FCB may include a flexible circuit board and the like. The driving chip may be provided by being mounted on the flexible circuit board, but embodiments are not limited thereto. The driving chip may be connected (e.g., electrically connected) to the display module DM to control the display panel DP (see FIG. 5), the input sensor IS (see FIG. 5), and the like.

In a manufacturing process of a display device, an end portion of the display module DM to which the driving unit FCB is attached and the driving unit FCB may be bent in a lower surface direction of the display module DM. The end portion of the display module DM and the driving unit FCB which are bent may be accommodated inside the housing HAU (see FIG. 2). In the following drawings, the driving unit FCB is omitted, but this is only for convenience of description. Hereinafter, in the preliminary display device and the display device, the driving unit FCB may be connected (e.g., electrically connected) to an end of the display module DM.

In the method for manufacturing a display device according to an embodiment, the providing of the first preliminary display device PED-S1 in the step of providing of the preliminary display device (S10) may include a step of providing the display module DM to which the driving unit FCB is attached, and a step of disposing the optical layer PM on the display module DM.

Referring to FIG. 7A, the length of the display module DM in a direction parallel to the second direction DR2 may be greater than the length of the optical layer PM in the direction. The display module DM may be provided longer than other members including the optical layer PM in consideration of a portion to which the driving unit FCB is attached and a portion to be bent later. Accordingly, a portion of the display module DM may be exposed without being covered by the optical layer PM and the like.

Figure 8A:
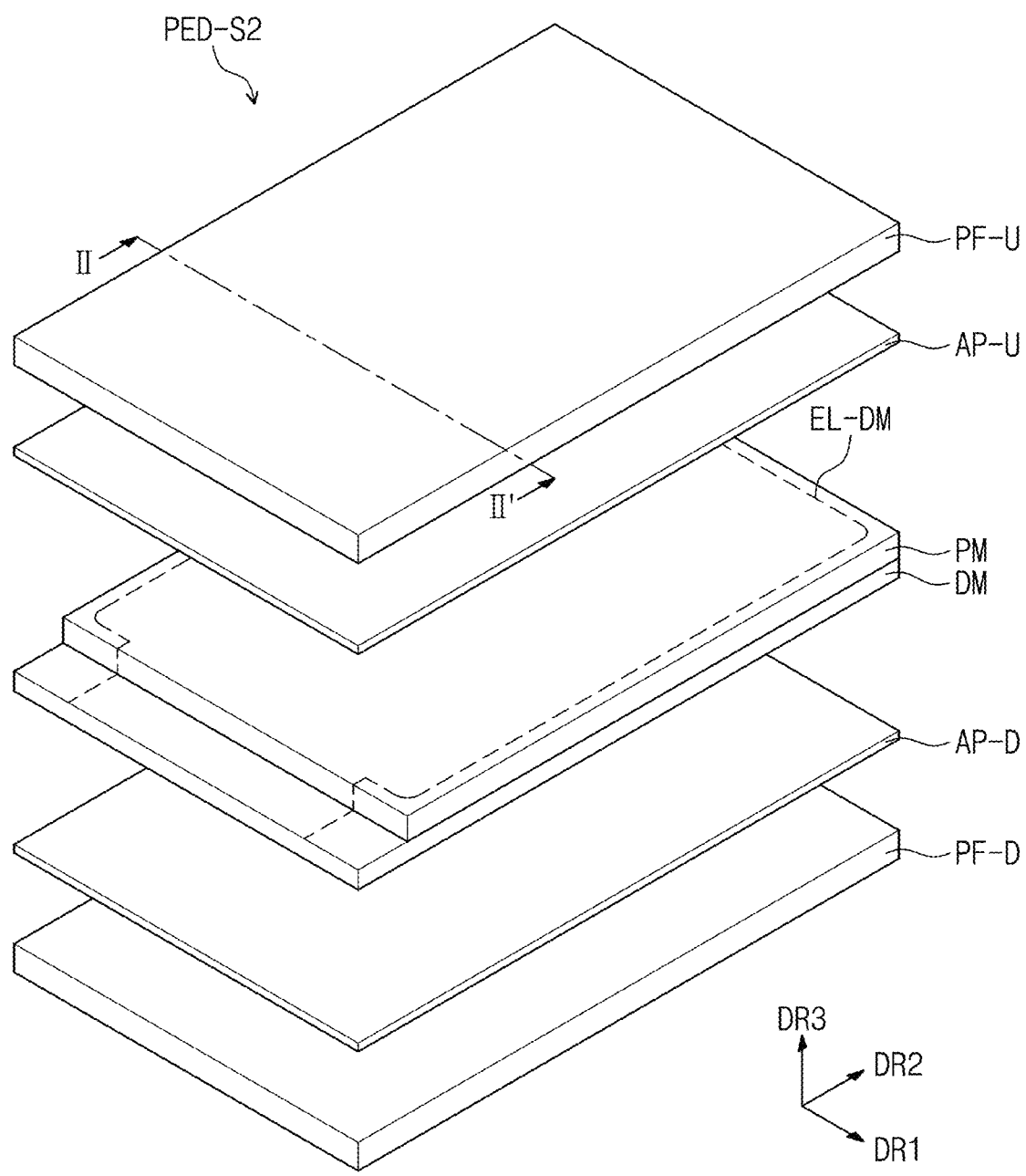
FIG. 8A is a schematic view showing a step of a method for manufacturing a display device according to an embodiment.
Figure 8B:
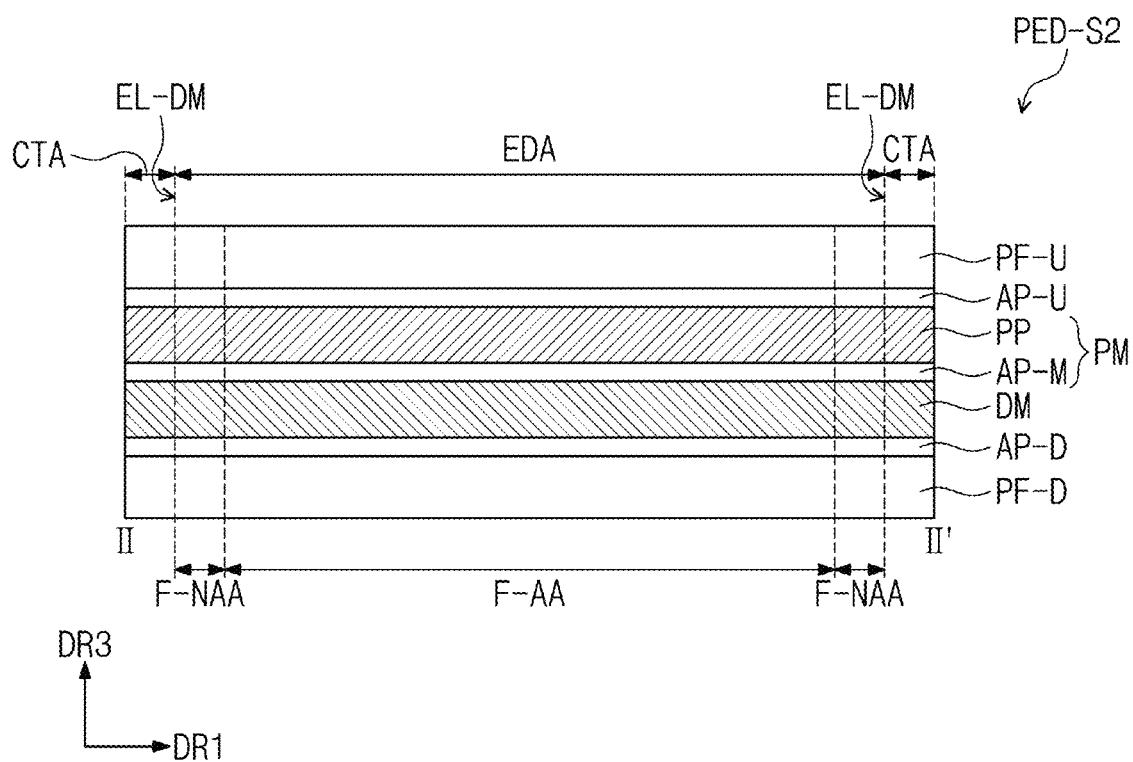
FIG. 8B is a schematic cross-sectional view of a preliminary display device in a step of a method for manufacturing a display device according to an embodiment.

FIG. 8A and FIG. 8B illustrate a step of providing the second preliminary display device PED-S2 which includes the first adhesive layer AP-U and the first protective film PF-U disposed on the upper side of the optical layer PM and includes the second adhesive layer AP-D and the second protective film PF-D on the lower side of the display module DM. FIG. 8B shows a cross-section corresponding to line II-II' of FIG. 8A FIG. 8A illustrates a step of sequentially providing the first adhesive layer AP-U and the first protective film PF-U on the upper side of the optical layer PM and sequentially providing the second adhesive layer AP-D and the second protective film PF-D on the lower side of the display module DM. The second preliminary display device PED-S2 may include the second protective film PF-D, the second adhesive layer AP-D, the display module DM, the optical layer PM including the third adhesive layer AP-M and the polarizing plate PP, the first adhesive layer AP-U, and the first protective film PF-U which are sequentially laminated in the third direction DR3.

In an embodiment, the first adhesive layer AP-U provided on the optical layer PM may be provided on the optical layer PM as a member separate from the optical layer PM. However, in an embodiment, the first adhesive layer AP-U may be attached to an upper surface of the optical layer PM and be provided on the display module DM as a single component with the optical layer PM. For example, from the steps of the method for manufacturing a display device, the step of providing the first adhesive layer AP-U on the optical layer PM may be omitted. For example, in case that the optical layer PM is provided in a laminated structure including the first adhesive layer AP-U, a process step of bonding the first adhesive layer AP-U on the optical layer PM may be omitted, so that the productivity of a manufacturing process of a display device may be increased.

The first protective film PF-U and the second protective film PF-D may each be a polymer film. For example, the first protective film PF-U and the second protective film PF-D may be optically clear polymer films. In an embodiment, the first protective film PF-U and the second protective film PF-D may be polyethylene terephthalate (PET) films or polyimide (PI) films. However, embodiments are not limited thereto. Any material may be used without limitation as long as it has mechanical properties capable of supporting a preliminary display device and protecting the preliminary display device during the manufacturing process and has optical transmittance at which laser light is transmitted.

For example, in an embodiment, the first protective film PF-U may be a polyethylene terephthalate (PET) film, and may have a transmittance of laser light of 70% or greater.

Figure 9A:
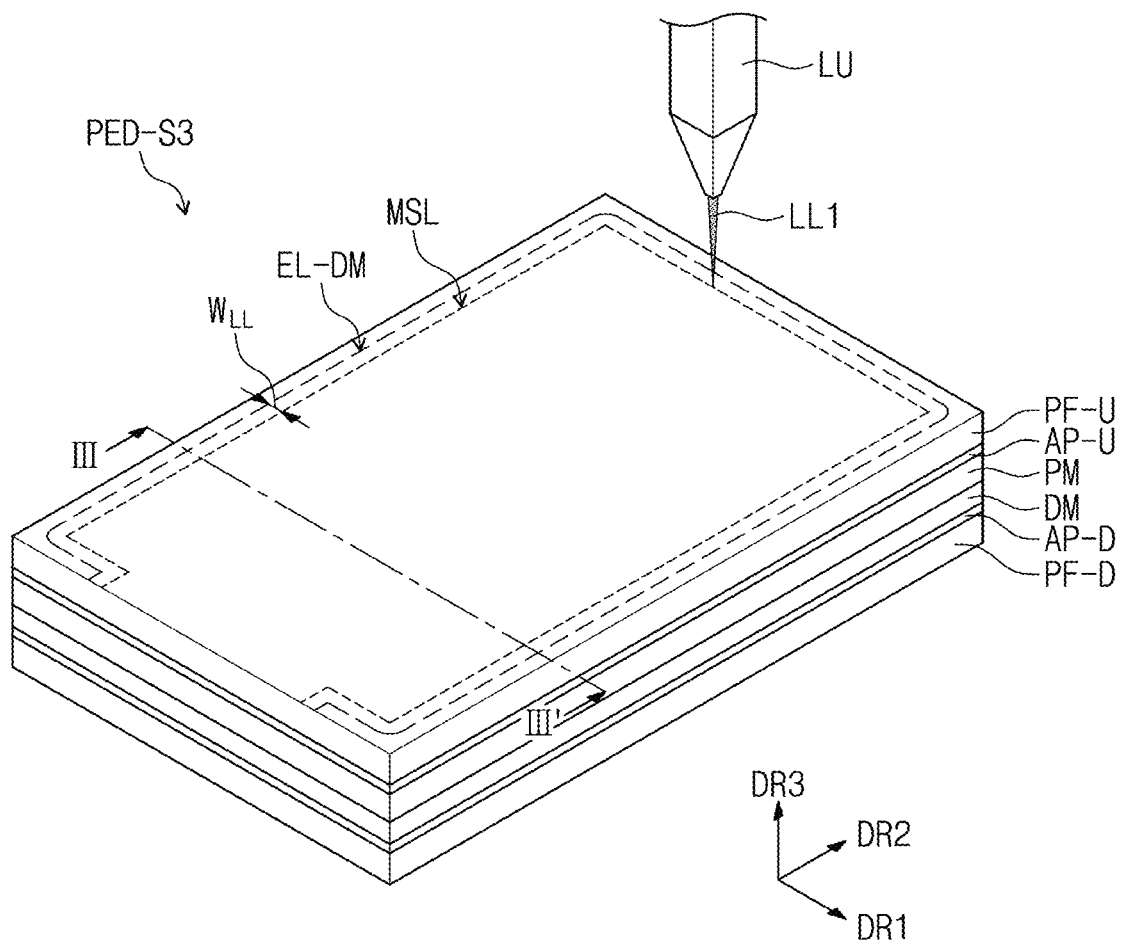
FIG. 9A is a schematic view exemplarily showing a step of a method for manufacturing a display device according to an embodiment.
Figure 9B:
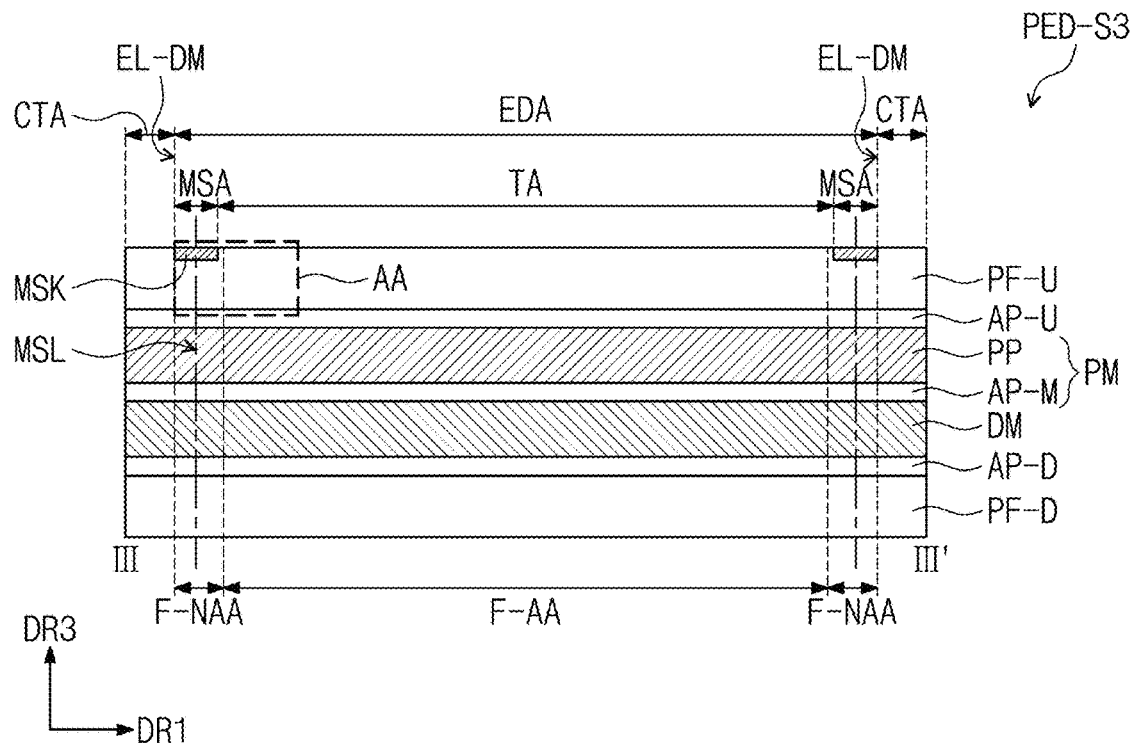
FIG. 9B is a schematic cross-sectional view of a preliminary display device in a step of a method for manufacturing a display device according to an embodiment.
Figure 9C:
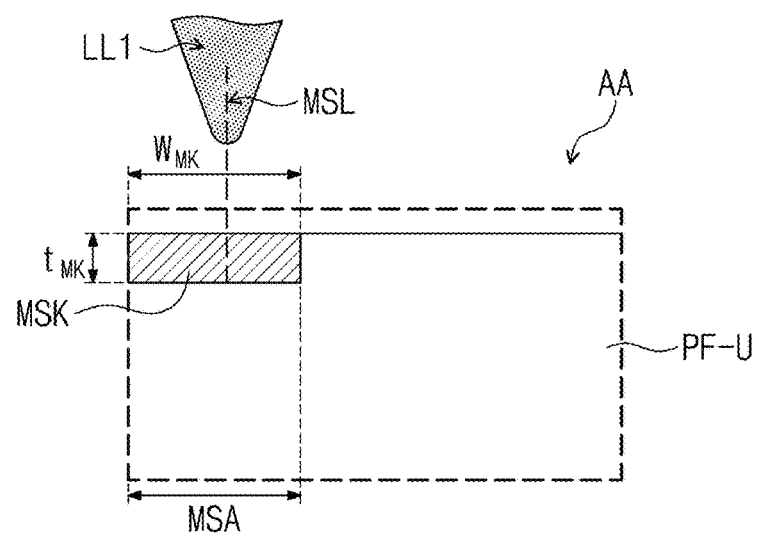
FIG. 9C is a schematic cross-sectional view of a portion of a preliminary display device according to an embodiment.

FIGS. 9A, 9B, and 9C are schematic views illustrating the forming of the mask layer on the first protective film PF-U (S20 in FIG. 6). FIG. 9A illustrates the step of forming the mask layer on the first protective film PF-U, which is a step of the method for manufacturing a display device, and FIG. 9B shows a cross-section of the third preliminary display device PED-S3 after the step of forming the mask layer on the first protective film PF-U. FIG. 9C is a schematic cross-sectional view of a portion of the third preliminary display device. FIG. 9B is a schematic cross-sectional view of a portion corresponding to line III-III' of FIG. 9A, and FIG. 9C is a schematic view showing enlarged AA region of FIG. 9B.

The forming of the mask layer on the first protective film PF-U (S20 in FIG. 6) may be a step of forming the mask layer MSK on the first protective film PF-U by providing a first laser light LL1 from above the first protective film PF-U along a first processing line MSL. The first processing line MSL may be a virtual line which may refer to a mapping line programmed for the operation of a laser light unit LU used for manufacturing a display device.

The first processing line MSL may be positioned on the inside of the display device edge line EL-DM. The display device edge line EL-DM may be (or overlap) a second processing line EL-DM to which a second laser light for cutting the shape of the display device is provided in a later step of the method for manufacturing a display device, and the display device edge line EL-DM may be referred to as the second processing line EL-DM.

In the step of forming the mask layer on the first protective film PF-U, the first laser light LL1 may be provided once along the first processing line MSL. However, embodiments are not limited thereto. As long as the mask layer MSK which is capable of performing a masking function by blocking a laser light can be formed, the first laser light LL1 may be provided (or irradiated) a plurality of times along the first processing line MSL. However, a total energy of the laser light provided to the first processing line MSL by the first laser light LL1 may be a degree of energy capable of forming the mask layer MSK on the first protective film PF-U by the first laser light LL1, which is an amount of energy which does not modify the entire first protective film PF-U and does not cause damage the optical layer PM disposed on a lower side (e.g., a lower surface or a second surface) of the first protective film PF-U.

The first laser light LL1 may be ultraviolet light. For example, the first laser light LL1 may be ultraviolet light having a center wavelength of about 345 nm, or ultraviolet light having a center wavelength of about 355 nm. However, the center wavelength of the first laser light LL1 provided in the step of forming the mask layer on the first protective film PF-U (S20 in FIG. 6) in an embodiment is not limited to what is illustrated. For example, the center wavelength may be a portion where an intensity of the laser light is the greatest. FIG. 9C illustrates that a peak portion of the first laser light LL1 provided may correspond to (or may be aligned with) the first processing line MSL, and at this time, the peak portion may correspond to a portion where the intensity of the laser light is the greatest.

The first laser light LL1 provided in the laser light unit LU may be provided (or irradiated) along the first processing line MSL positioned in the peripheral region F-NAA. The mask layer MSK may be formed on the first protective film PF-U by the first laser light LL1 provided along the first processing line MSL. The mask layer MSK may be formed in an upper portion of the first protective film PF-U.

The mask layer MSK may be formed by the carbonization of a portion of the first protective film PF-U by the first laser light LL1 provided to the first protective film PF-U. By irradiating the first laser light LL1 on the first protective film PF-U, the properties or surface shape of the material of an upper surface portion of the first protective film PF-U may be deformed by light and heat to form the mask layer MSK. In an embodiment, the mask layer MSK of the first protective film PF-U may be a portion in which a portion of the first protective film PF-U includes a carbide damaged (or formed) by the first laser light LL1.

In an embodiment, the first protective film PF-U may be a polyethylene terephthalate (PET) film, and the mask layer MSK may be a portion including a carbide generated by the polyethylene terephthalate modified by the first laser light LL1. For example, the mask layer MSK may be a portion formed by the deformation of the upper surface of the first protective film PF-U by the irradiation of the first laser light LL1, and the upper surface of the mask layer MSK may be a portion with increased surface roughness compared to (or than) an upper surface of the first protective film PF-U not irradiated with the first laser light LL1.

The mask layer MSK including the carbide may have a decreased transmittance due to the carbide. For example, the upper surface of the mask layer MSK may have light scattering due to the increased roughness thereof, so that the transmittance of the laser light of the first protective film PF-U in a portion in which the mask layer MSK is formed may be decreased.

In the method for manufacturing a display device according to an embodiment, a thickness $t_{MK}$ of the mask layer MSK formed on the first protective film PF-U may be about m or greater. The thickness $t_{MK}$ of the mask layer MSK may be about 10 µm or greater, and may be less than a thickness of the first protective film PF-U. For example, the thickness $t_{MK}$ of the mask layer MSK may be about 10 µm or greater, and may be less than or equal to ½ of the thickness of the first protective film PF-U. In case that the thickness of the first protective film PF-U is about 70 µm, the thickness $t_{MK}$ of the mask layer MSK may be about m to about 35 µm. In an embodiment, the thickness $t_{MK}$ of the mask layer MSK may be the thickness of a portion including the carbide generated by a portion of the first protective film PF-U damaged by the first laser light LL1.

The first processing line MSL may be spaced apart from the display device edge line EL-DM. A separation distance $W_{LL}$ between the first processing line MSL and the display device edge line EL-DM, which is the second processing line EL-DM, may be in a range of about 10 µm to about 30

µm. By forming the mask layer MSK with a width by spacing the first processing line MSL apart from the display device edge line EL-DM by 10 µm or greater, damage to members may be prevented such as the optical layer PM disposed in the lower portion of the first protective film PF-U in case that the second laser light is provided later. For example, by spacing the first processing line MSL apart from the display device edge line EL-DM by 30 µm or less, regions of display module members may be deformed by the first laser light LL1 to be disposed in the peripheral region F-NAA.

A width $W_{MK}$ of the mask layer MSK formed on the first protective film PF-U may be a range of about 40 µm to about 50 µm. The width $W_{MK}$ of the mask layer MSK may be adjusted or changed according to a beam size of the first laser light LL1 provided. The width $W_{MK}$ of the mask layer MSK may be the width of a region centered on the first processing line MSL to which the first laser light LL1 is provided.

The first protective film PF-U may include a masking region MSA which is a portion including the mask layer MSK, and a transmissive region TA positioned on the inside of the masking region MSA. On a plane parallel to the display module DM (or in a plan view), the width of the masking region MSA and the width $W_{MK}$ of the mask layer MSK may be same as each other.

The transmittance of the laser light in the transmissive region TA of the first protective film PF-U may be greater than the transmittance of laser light in the masking region MSA of the first protective film PF-U. For example, the transmittance of a second laser light LL2 (see FIG. 10A) in the transmissive region TA may be greater than the transmittance of the second laser light LL2 (see FIG. 10A) in the masking region MSA.

Figure 10A:
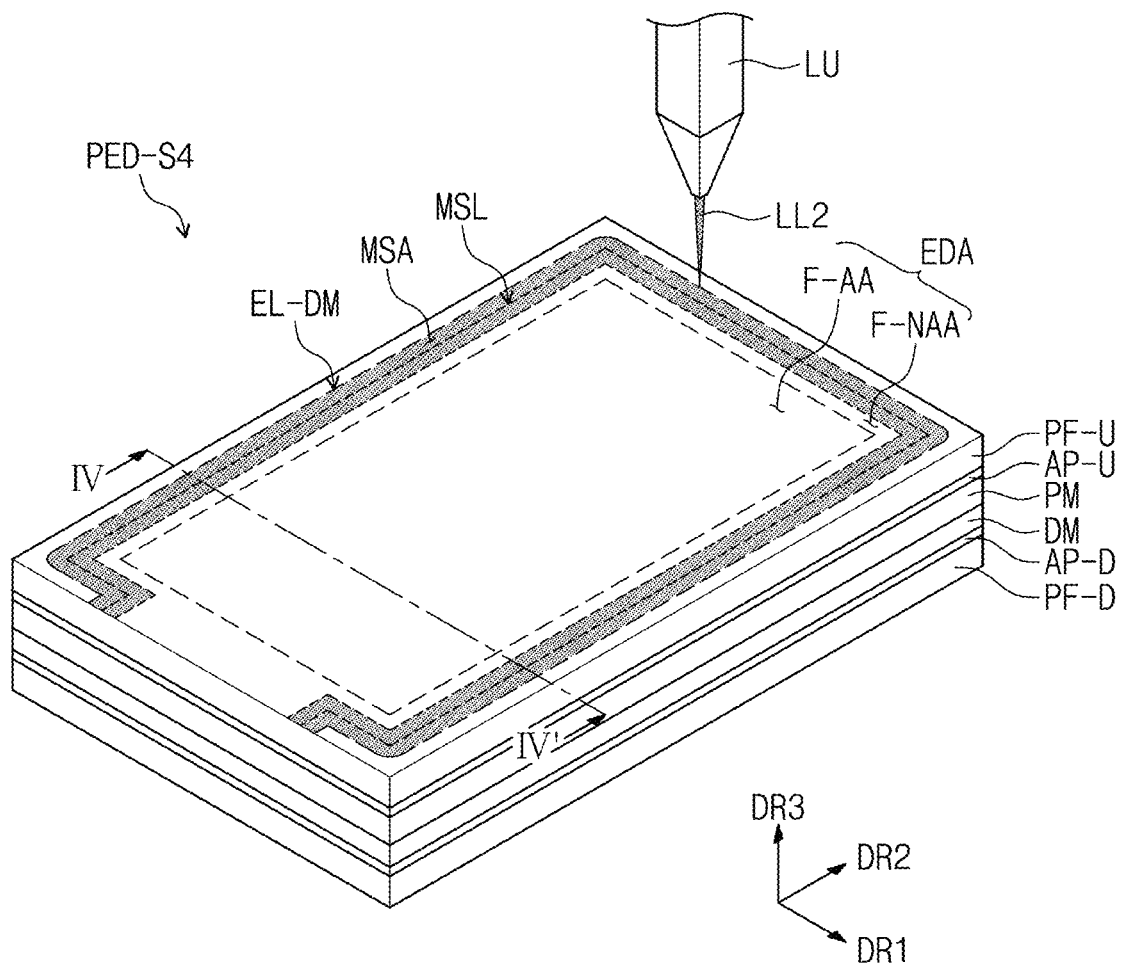
FIG. 10A is a schematic view exemplarily showing a step of a method for manufacturing a display device according to an embodiment.
Figure 10B:
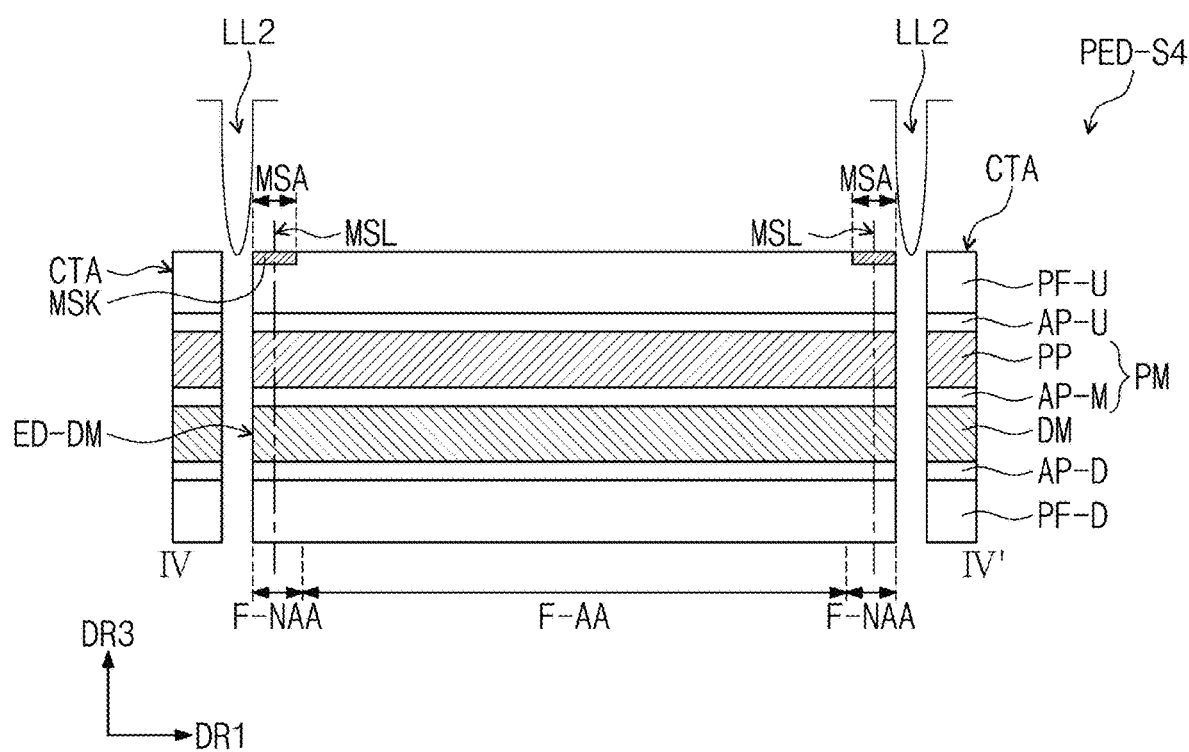
FIG. 10B is a schematic cross-sectional view of a preliminary display device in a step of a method for manufacturing a display device according to an embodiment.

FIG. 10A and FIG. 10B are schematic views illustrating the cutting of the preliminary display device at the outer periphery of the second processing line EL-DM (S30 in FIG. 6). FIG. 10A illustrates the step of cutting the preliminary display device at the outer periphery of the second processing line EL-DM, which is a step of the method for manufacturing a display device, and FIG. 10B shows a cross-section of the preliminary display device after the step of cutting the preliminary display device at the outer periphery of the second processing line EL-DM. FIG. 10B may be a schematic cross-sectional view of a portion corresponding to line IV-IV' of FIG. 10A.

The step of cutting the preliminary display device at the outer periphery of the second processing line EL-DM (S30 in FIG. 6) may be a step of cutting the preliminary display device at the outer periphery of the second processing line EL-DM by providing the second laser light LL2 along the second processing line EL-DM which is positioned at the outer periphery of the first processing line MSL. The second processing line EL-DM may be a virtual line which refers to a mapping line programmed for the operation of the laser light unit LU used for manufacturing a display device. The mapped second processing line EL-DM may correspond to (or may be aligned with) an edge line in a final display device.

In the step of cutting the preliminary display device at the outer periphery of the second processing line EL-DM, by providing the second laser light, thereby cutting the preliminary display device at the outer periphery of the second processing line EL-DM, it is possible to provide the fourth preliminary display device PED-S4 processed into the shape of the display device and including a structure in which the display module DM, the optical layer PM, and the first protective film PF-U, the second protective film PF-D, the first adhesive layer AP-U, and the second adhesive layer AP-D are laminated.

The step of cutting the preliminary display device at the outer periphery of the second processing line EL-DM may be a step of removing the processing region CTA at the outer periphery of the display device region EDA by providing the second laser light LL2 from above the first protective film PF-U on which the mask layer MSK is formed.

The second laser light LL2 provided in the step of cutting the preliminary display device at the outer periphery of the second processing line EL-DM (S30 in FIG. 6) may be ultraviolet light. For example, the second laser light LL2 may be ultraviolet light having a center wavelength of about 345 nm, or ultraviolet light having a center wavelength of about 355 nm.

The mask layer MSK formed on the first protective film PF-U may be a portion which reduces the transmittance of the second laser light LL2. The mask layer MSK formed on the first protective film PF-U may block a portion of the second laser light LL2 which is ultraviolet light.

The transmittance of the second laser light LL2 irradiated on an upper side (e.g., an upper surface or a first surface) of the first protective film PF-U and reaching (or being incident on) an upper surface of the optical layer PM by transmitting the masking region MSA in which the mask layer MSK is formed may be about 7% or less. In case that an initial intensity of the second laser light LL2 provided to the mask layer MSK from the upper side of the first protective film PF-U may be set to 100%, the transmittance of the second laser light LL2 reaching (or being incident on) the upper surface of the optical layer PM by passing through the masking region MSA may be about 7% or less of the initial intensity.

Accordingly, damage to the optical layer PM by the second laser light LL2 in a portion corresponding to (or overlapping) the masking region MSA in which the mask layer MSK is formed may be reduced and minimized. For example, the method for manufacturing a display device according to an embodiment may improve the reliability of a display device manufactured thereby by minimizing damage such as deformation and cracks of the optical layer PM which are generated by a manufacturing process of the display device by using laser light.

For example, the intensity of the second laser light LL2 provided to the mask layer MSK may be less than the intensity of the second laser light LL2 provided on the second processing line EL-DM. For example, a beam of the second laser light LL2 may be provided such that a portion thereof having the greatest intensity may correspond to (or may be aligned with) the second processing line EL-DM, and the processing region CTA may be removed from the display device region EDA by providing the second laser light LL2 along the second processing line EL-DM. For example, in the method for manufacturing a display device according to an embodiment, the shape of the display device region EDA may be cut by a laser cutting method.

A total energy of the second laser light LL2 provided along the second processing line EL-DM may be a degree of energy capable of separating the processing region CTA, which is an outer periphery portion of the fourth preliminary display device PED-S4, which is significantly greater than the total energy of the first laser light LL1 (see FIG. 9A) provided along the first processing line MSL in the step of forming the mask layer on the first protective film PF-U described above.

In the step of cutting the preliminary display device at the outer periphery of the second processing line EL-DM, the step of providing the second laser light LL2 along the second processing line EL-DM may be performed a plurality of times. In the method for manufacturing a display device according to an embodiment, after the mask layer MSK is formed on the first protective film PF-U, a step of irradiating the second laser light LL2 with moving the same along the second processing line EL-DM from the upper portion of the first protective film PF-U may be repeated a plurality of times. For example, the second processing line EL-DM may be positioned at the outer periphery of the masking region MSA. However, embodiments are not limited thereto. The second processing line EL-DM may be positioned inside the masking region MSA.

A cross-section of the display device region EDA (see FIG. 7B) which is exposed after the processing region CTA is removed along the second processing line EL-DM may correspond to an edge side of the display module DM.

In the forming of the mask layer on the first protective film PF-U (S20 in FIG. 6), the total energy of the first laser light LL1 provided to the first processing line MSL may be about 1/100 to about 1/70 of the total energy of the second laser light LL2 provided to the second processing line ED-DM in the step of cutting the preliminary display device at the outer periphery of the second processing line ED-DM (S30 in FIG. 6). For example, in the forming of the mask layer on a first protective film PF-U (S20 in FIG. 6), the first laser light LL1 may be provided once along the first processing line MSL, and then in the step of cutting the preliminary display device at the outer periphery of the second processing line ED-EM (S30 in FIG. 6), the second laser light LL2 may be provided a plurality of times along the second processing line ED-DM, and at this time, the total energy of the first laser light LL1 provided along the first processing line MSL may be about 1/100 to about 1/70 of the total energy of the second laser light LL2 irradiated a plurality of times onto the second processing line ED-DM. For example, the energy of the first laser light LL1 provided in the step of forming the mask layer on the first protective film PF-U (S20 in FIG. 6) may correspond to (or may be) a degree of low energy capable of forming a mask on a protective film, and the energy of the second laser light LL2 provided in the step of cutting the preliminary display device at the outer periphery of the second processing line EL-DM (S30 in FIG. 6) may correspond to (or may be) a degree of significantly high energy capable of cutting all laminated components constituting the preliminary display device.

For example, the method for manufacturing a display device according to an embodiment may include the step of forming the mask layer on the first protective film, PF-U thereby providing the mask layer capable of blocking a portion of the laser light in a laser cutting process by using the second laser light to prevent damage to components of the display device during the step of cutting by using the laser light.

For example, the method for manufacturing a display device according to an embodiment may use a front surface processing method in which the second laser light LL2 for cutting is irradiated on the upper surface of the first protective film PF-U disposed in an upper portion of the optical layer PM, and thus, may minimize the transferring of residues of the first adhesive layer AP-U to the first protective film PF-U, compared to a case of using a rear surface processing method in which a laser light for cutting is irradiated on a lower surface of a preliminary display device. Accordingly, the method for manufacturing a display device according to an embodiment, the method by using the front surface processing method (or the upper surface processing method), may minimize residues of the first adhesive layer AP-U and the like to facilitate the detachment of the first protective film PF-U and may improve the reliability of the display device after the step of cutting the preliminary display device at the outer periphery of the second processing line EL-DM.

Figure 11:
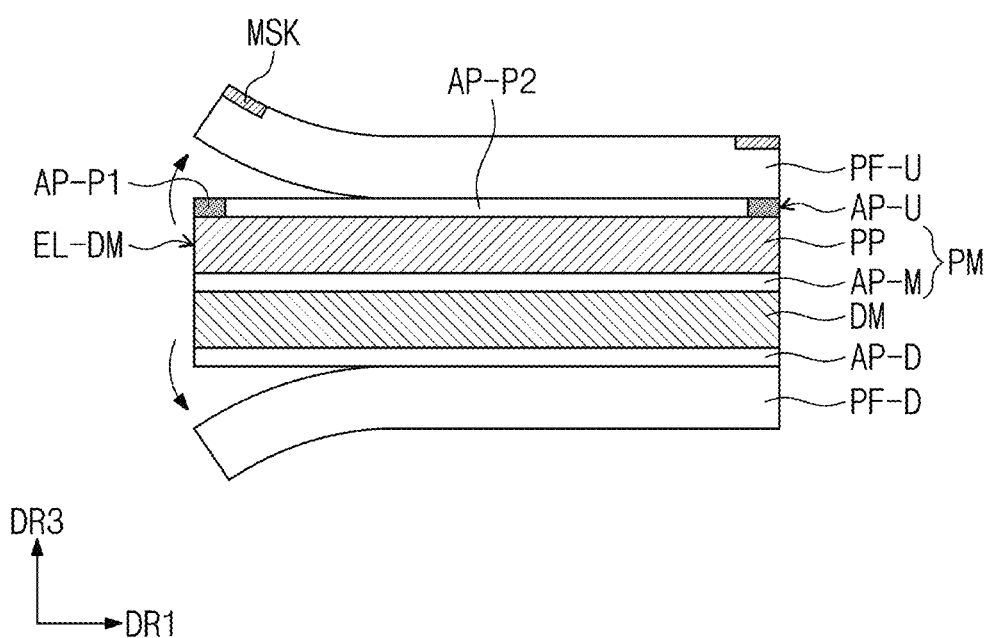
FIG. 11 is a schematic view exemplarily showing a step of a method for manufacturing a display device of an embodiment.

FIG. 11 is a schematic view illustrating a step of a method for manufacturing a display device according to an embodiment. FIG. 11 illustrates a step of detaching the first protective film PF-U and the second protective film PF-D.

After the step of cutting the preliminary display device at the outer periphery of the second processing line EL-DM described with reference to FIG. 10A and FIG. 10B, the detaching of the first protective film PF-U (S40 in FIG. 6) and the detaching of a second protective film PF-D (S60 in FIG. 6) may be performed. For example, in the method for manufacturing a display device according to an embodiment, the step of providing a window on an upper surface of the first adhesive layer AP-U (S50 in FIG. 6) may be performed after the step of detaching the first protective film PF-U (S40 in FIG. 6), and the step of providing a support member on a lower surface of the second adhesive layer AP-D (S70 in FIG. 6) may be performed after the step of detaching the second protective film PF-D (S60 in FIG. 6).

In the method for manufacturing a display device according to an embodiment, after the processing region is provided by the step of cutting the preliminary display device at the outer periphery of the second processing line EL-DM, the protective films PF-U and PF-D which protect the optical layer PM and the display module DM may be removed.

In a display device manufactured by the method for manufacturing a display device, the method providing a laser light from the upper side of the first protective film PF-U, the first adhesive layer AP-U may be disposed on the lower side of the first protective film PF-U, so that the deformation by the laser light may be minimized. Accordingly, the generation residues of an adhesive layer transferred to neighboring layers of the first adhesive layer AP-U may be reduced, and the first protective film PF-U may be readily detached.

Figure 12A:
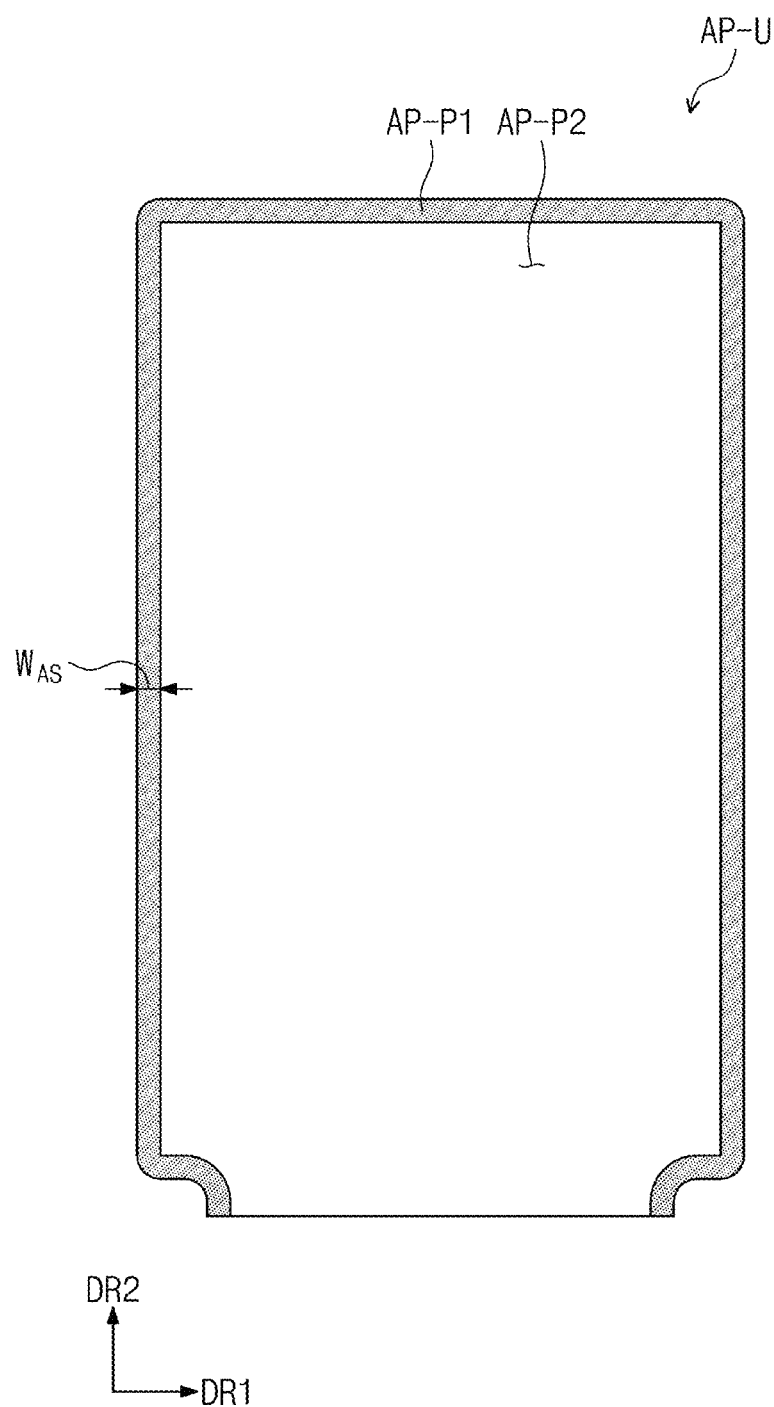
FIG. 12A is a schematic plan view showing a first adhesive layer according to an embodiment.
Figure 12B:
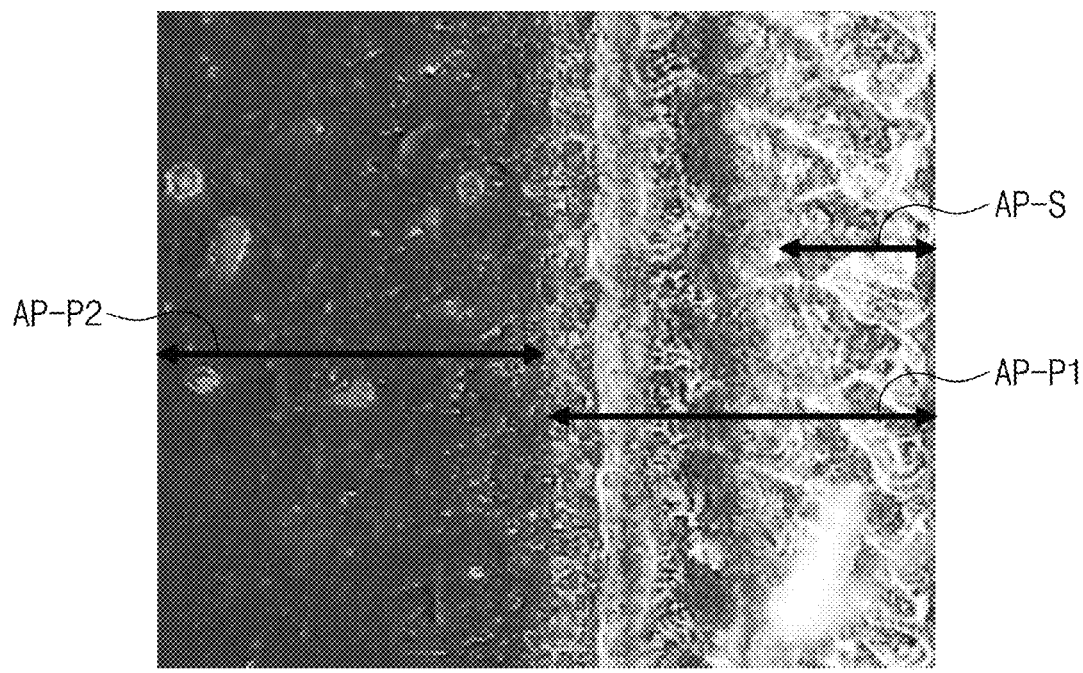
FIG. 12B is an image of an upper surface of a first adhesive layer according to an embodiment.

FIG. 12A is a schematic plan view showing a first adhesive layer included in a display device manufactured by the method for manufacturing a display device according to an embodiment. FIG. 12B shows an image of the surface of a first adhesive layer included in a display device manufactured by the method for manufacturing a display device according to an embodiment, the image obtained with a scanning electron microscope (SEM).

Referring to FIG. 12A, the first adhesive layer AP-U included in the display device manufactured by the method for manufacturing a display device according to an embodiment may include a first portion AP-P1 and a second portion AP-P2 positioned on an inner side of the first portion AP-P1. The first portion AP-P1 may be a portion formed by the deformation of a portion of the first adhesive layer AP-U corresponding to the mask layer in the step of forming the mask layer on the first protective film PF-U described with reference to FIG. 9A to FIG. 9C.

As compared to the second portion AP-P2, the first portion AP-P1 may be a portion in which the transmittance of light is relatively decreased. An upper surface of the first portion AP-P1 may have a surface which is partially damaged by a laser light, and thus, is not flat. The roughness of the upper surface of the first portion AP-P1 may be greater than the roughness of an upper surface of the second portion AP-P2.

In the first adhesive layer AP-U including acrylic polymers, the average molecular weight of the acrylic polymers included in the first portion AP-P1 may be less than the average molecular weight of the acrylic polymers included in the second portion AP-P2. For example, some of the acrylic polymers included in the first portion AP-P1 may be deformed or decomposed by the laser light provided, and thus, may have a relatively small molecular weight. However, even in the first portion AP-P1 partially deformed, good adhesion for the window WM (see FIG. 13) disposed in an upper portion thereof may be implemented.

Referring to FIG. 12B, the first portion AP-P1 may have a shape with a deformed surface compared to the second portion AP-P2. For example, in an end portion AP-S of the first portion AP-P1 adjacent to an edge portion of the display device, an upper surface of an adhesive layer may be more damaged than the other portions. For example, in case that the laser light is blocked by the mask layer MSK (see FIG. 11), the laser light transmitting the mask layer MSK (see FIG. 11) may be provided to the first adhesive layer and form a deformed portion such as the first portion AP-P1. For example, due to high energy of the laser light provided in the step of cutting the preliminary display device at the outer periphery of the second processing line EL-DM described with reference to FIG. 10A and FIG. 10B, the end portion AP-S may be additionally deformed.

Figure 13:
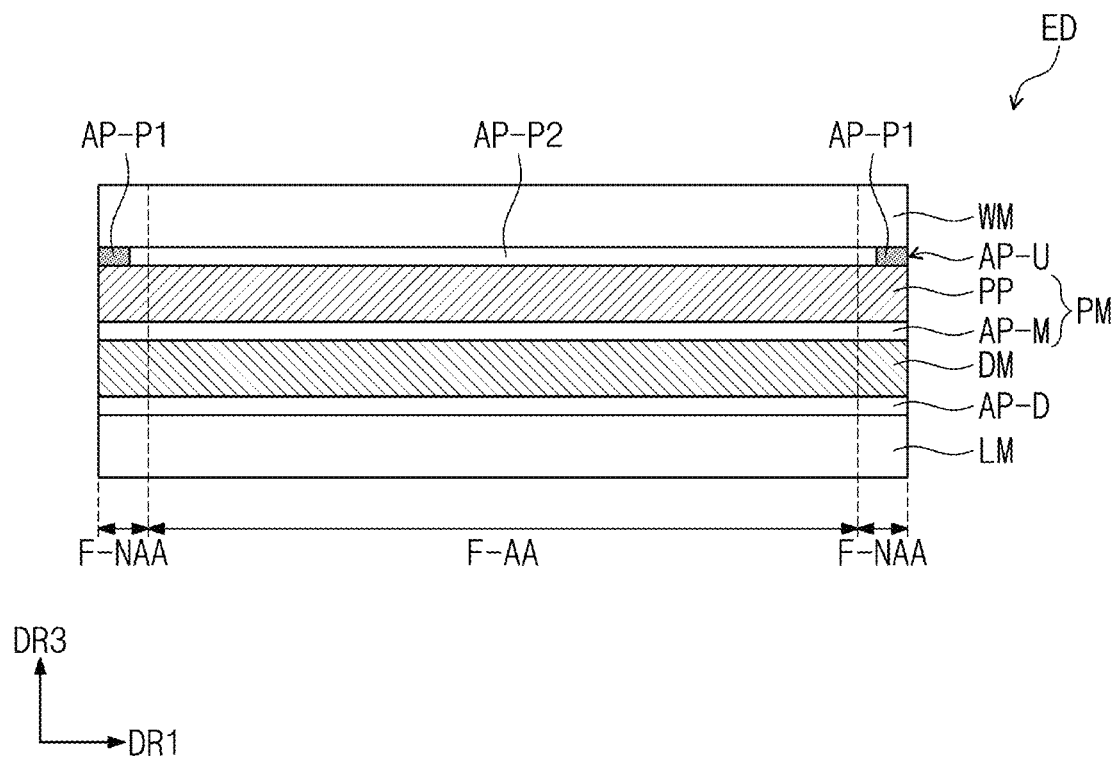
FIG. 13 is a schematic view showing a step of a method for manufacturing a display device according to an embodiment.

FIG. 13 is a schematic cross-sectional view illustrating a display device after detaching a protective film, and providing a window and a support member. FIG. 13 may show an embodiment of a display device manufactured by the method for manufacturing a display device according to an embodiment described above.

The display device ED manufactured by the method for manufacturing a display device according to an embodiment may include the support member LM, the second adhesive layer AP-D, the display module DM, the optical layer PM, the first adhesive layer AP-U, and the window WM sequentially laminated in the third direction DR3. The display device ED may include the active region F-AA and the peripheral region F-NAA. For example, the first adhesive layer AP-U may include the first portion AP-P1 having a low transmittance, and the second portion AP-P2 positioned on an inner side of the first portion AP-P1 and having a higher transmittance than the first portion AP-P1. The first portion AP-P1 may be a portion included in a peripheral region F-NAA.

In the method for manufacturing a display device according to an embodiment, the optical layer PM may not be damaged by the laser light since a portion corresponding to (or overlapping) a processing line in a cutting process by using the laser light is covered and protected by the mask layer MSK (see FIG. 11). Accordingly, the display device manufactured by the method for manufacturing a display device according to an embodiment may have excellent reliability.

For example, the method for manufacturing a display device according to an embodiment described with reference to FIG. 6 to FIG. 13 may be applied to the manufacturing of the display device including the folding region illustrated in FIG. 3A to FIG. 4. In the case of manufacturing the display device including the folding region illustrated in FIG. 3A to FIG. 4, there is a difference in that members capable of improving the folding properties of a support member may be further included as compared to the manufacturing of the display device according to an embodiment described with reference to FIG. 1 and FIG. 2.

Table 1 below shows the results of evaluating the reliability of preliminary display devices manufactured by methods for manufacturing a display device of Comparative Examples and Examples. In Table 1, Comparative Example 1 and Comparative Example 2 correspond to those manufactured by a method for manufacturing a display device in which, unlike the embodiment, the step of forming a mask layer on a protective film before the step of cutting a processing region at the outer periphery of a display device region by using a laser light is not performed. Comparative Example 1 is an evaluation result of a preliminary display device manufactured by a method for manufacturing a display device by using a rear surface processing in which a laser light is irradiated on a lower side (e.g., a lower surface or a second surface) of a display module. Comparative Example 2 is an evaluation result of a preliminary display device manufactured by a method for manufacturing a display device by using a front surface processing in which a laser light is irradiated on an upper side (e.g., an upper surface or a first surface) of an optical layer. Example corresponds to an evaluation result of a preliminary display device manufactured by the method for manufacturing a display device. The preliminary display devices manufactured by the manufacturing methods of Comparative Example 1, Comparative Example 2, and Example used for the evaluation of Table 1 may correspond to the fourth preliminary display device shown in FIG. 10B.

The "polarizing plate crack" in Table 1 represents whether there are cracks generated in a polarizing plate after the cutting of the processing region, wherein "X" denotes there are no cracks generated and "O" denotes there are cracks generated.

For example, of the de-lamination evaluation items in Table 1, Evaluation 1 represents whether adhesive residues are transferred at the time of removing the first protective film PF-U (see FIG. 11), and Evaluation 2 represents whether adhesive residues are transferred at the time of removing the second protective film PF-D (see FIG. 11). The evaluation results in Evaluation 1 and Evaluation 2 are described in the order of "Number of failures/Total number of evaluations (Defect rate %)"

TABLE 1

| Classifications | Polarizing plate crack | De-lamination evaluation | |
|---|---|---|---|
| | | Evaluation 1 | Evaluation 2 |
| Comparative Example 1 | X | 15/20(75%) | 6/20(30%) |
| Comparative Example 2 | O | 0/30(0%) | 0/30(0%) |
| Examples | X | 0/427(0%) | 0/427(0%) |

Referring to the results of Table 1, in the case of Comparative Example 1 in which the rear surface processing method is used, there is no crack generated in the polarizing plate, but the failure rate is high in the de-lamination evaluation of a protective film. For example, during the rear surface processing, the first adhesive layer is processed first, and then the first protective film PF-U is processed with a laser light, so that the rate of defective detachment of the first protective film PF-U is higher than that of defective detachment of the second protective film.

For example, in the case of Comparative Example 2 in which the front surface processing method is used, there is no defective detachment in the de-lamination evaluation. However, cracks may be generated in the polarizing plate since the polarizing plate disposed relatively closer to the laser light is not protected during the cutting process by using the laser.

In comparison, in the preliminary display device manufactured by the method for manufacturing a display device according to an embodiment, there is no crack generated in the polarizing plate, and there is not defective detachment occurred in the detachment test of a protective film.

In a method for manufacturing a display device, the method including a laser cutting method in which some regions of a display device is cut by using a laser light, the reliability of a manufactured display device may be improved by providing a mask layer capable of blocking a portion of the laser light before the laser cutting process.

A method for manufacturing a display device according to an embodiment may include a step of forming a mask layer by using a laser light on an upper surface of a protective film provided during a display device manufacturing process before a step of removing a processing region by using the laser light, so that the reliability of a finally manufactured display device may be improved by blocking a laser light provided during a laser cutting process by the mask layer.

For example, a display device according to an embodiment manufactured by the method for manufacturing a display device according to an embodiment has no damage to an optical layer since the edge of the optical layer is protected from a laser light during the manufacturing process, and may have excellent reliability since the transfer of adhesive layer residues caused by the deformation of an adhesive layer is reduced as well.

A method for manufacturing a display device according to an embodiment may include a step of forming a mask layer on a protective film by using laser light before a step of cutting a display module with the laser light, and thus, may prevent damage to components of a display device during the step of cutting by using the laser light.

A display device according to an embodiment may have excellent reliability since laser light is controlled from being irradiated (e.g., directly irradiated) into a display device region during a process of providing components at a lower portion of the display device.

Although the invention has been described with reference to embodiments of the invention, it will be understood by those skilled in the art that various modifications and changes in form and details may be made therein without departing from the spirit and scope of the invention as set forth in the following claims.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A method for manufacturing a display device, the method comprising:
    providing a preliminary display device including a display device region divided into a display region and a non-display region surrounding the display region, and a processing region disposed at an outer periphery of the display device region;
    forming a masking region on a first surface of the preliminary display device by irradiating a first laser light on the preliminary display device along a first processing line positioned in the non-display region; and
    removing the processing region by irradiating a second laser light along a second processing line disposed in a boundary area between the display device region and the processing region.

2. The method of claim 1, wherein
the preliminary display device comprises:
    a display module;
    an optical layer disposed on a first surface of the display module;
    a first protective film disposed on the optical layer;
    a second protective film disposed on a second surface of the display module;
    a first adhesive layer disposed between the optical layer and the first protective film; and
    a second adhesive layer disposed between the second protective film and the display module, and
the forming of the masking region comprises forming a mask layer on a first surface of the first protective film.

3. The method of claim 2, wherein:
the first laser light is incident on the first protective film and the first adhesive layer, but is not incident on the optical layer; and
the second laser light is irradiated on the preliminary display device so as to pass through the boundary area between the display device region and the processing region.

4. The method of claim 2, wherein a cut-surface of the display device region exposed after the removing of the processing region corresponds to an edge side of the display module.

5. The method of claim 2, further comprising:
detaching the first protective film after the removing of the processing region, and then providing a window on a first surface of the first adhesive layer from which the first protective film is detached; and
detaching the second protective film after the removing of the processing region, and then providing a support member on a second surface of the second adhesive layer from which the second protective film is detached.

6. A method for manufacturing a display device, the method comprising:
    providing a preliminary display device including:
        a display module;
        an optical layer disposed on a first surface of the display module;
        a first protective film disposed on the optical layer;
        a second protective film disposed on a second surface of the display module;
        a first adhesive layer disposed between the optical layer and the first protective film; and
        a second adhesive layer disposed between the second protective film and the display module;
    forming a mask layer on the first protective film by irradiating a first laser light on the first protective film along a first processing line; and
    cutting the preliminary display device at an outer periphery of a second processing line by irradiating a second laser light on the first protective film along the second processing line positioned at an outer periphery of the first processing line.

7. The method of claim 6, further comprising:
detaching the first protective film after the cutting of the preliminary display device; and providing a window on a first surface of the first adhesive layer from which the first protective film is detached after the detaching of the first protective film.

8. The method of claim 6, further comprising:
detaching the second protective film after the cutting of the preliminary display device; and
providing a support member on a second surface of the second adhesive layer from which the second protective film is detached after the detaching of the second protective film.

9. The method of claim 6, wherein
the first laser light is ultraviolet light having a center wavelength of about 345 nanometers or a center wavelength of about 355 nanometers, and
the second laser light is ultraviolet light having a center wavelength of about 345 nanometers or a center wavelength of about 355 nanometers.

10. The method of claim 6, wherein in a plan view, a distance between the first processing line and the second processing line parallel to the first processing line is in a range of about 10 micrometers to about 30 micrometers.

11. The method of claim 6, wherein in a plan view, a width of the mask layer is in a range of about 40 micrometers to about 50 micrometers.

12. The method of claim 11, wherein:
the mask layer is formed on a first surface of the first protective film; and
the mask layer comprises a carbide formed by the first laser light, the carbide having increased surface roughness than the first surface of the first protective film not irradiated with the first laser light.

13. The method of claim 12, wherein:
a thickness of the mask layer is a thickness of a portion including the carbide; and
the thickness of the mask layer is about 10 micrometers or greater.

14. The method of claim 6, wherein after the forming of the mask layer on the first protective film, the first protective film comprises:
a masking region in which the mask layer is formed; and
a transmissive region formed inside the masking region and having a transmittance of the second laser light higher than a transmittance of the masking region.

15. The method of claim 14, wherein the transmittance of the second laser light irradiated on the first protective film and being incident on a first surface of the optical layer through the masking region is about 7% or less.

16. The method of claim 6, wherein:
the first protective film comprises polyethylene terephthalate (PET); and
in the first protective film, a transmittance of the first laser light or the second laser light is about 70% or greater.

17. The method of claim 6, wherein:
the forming of the mask layer on the first protective film comprises irradiating the first laser light once along the first processing line; and
the cutting of the preliminary display device comprises irradiating the second laser light a plurality of times along the second processing line.

18. The method of claim 17, wherein a total energy of the first laser light irradiated along the first processing line is in a range of about $1/100$ to about $1/70$ of a total energy of the second laser light irradiated along the second processing line.

19. The method of claim 6, wherein:
the first protective film and the second protective film are polymer films; and
the first adhesive layer and the second adhesive layer are optically clear adhesive films or optically clear adhesive resin layers.

* * * * *